US005789071A

United States Patent [19]

Sproul et al.

[11] Patent Number: 5,789,071
[45] Date of Patent: Aug. 4, 1998

[54] MULTILAYER OXIDE COATINGS

[75] Inventors: William D. Sproul, Palatine; Scott A. Barnett; Anthony Lefkow, both of Evanston; Ming-Show Wong, Northbrook; Phillip Yashar, Glenview, all of Ill.

[73] Assignee: Northwestern University, Evanston, Ill.

[21] Appl. No.: 764,559

[22] Filed: Dec. 12, 1996

Related U.S. Application Data

[63] Continuation-in-part of Ser. No. 973,390, Nov. 9, 1992, abandoned, Ser. No. 388,020, Feb. 14, 1995, Ser. No. 635,472, Jun. 14, 1996, and Ser. No. 675,797, Jul. 5, 1996.

[51] Int. Cl.$^6$ ...................................................... B32B 7/02
[52] U.S. Cl. ........................... 428/216; 428/217; 428/336; 428/701; 428/702
[58] Field of Search ............................. 428/701, 702, 428/216, 336, 217

[56] References Cited

U.S. PATENT DOCUMENTS

| | | | |
|---|---|---|---|
| 4,428,811 | 1/1984 | Sproul et al. | 204/192 |
| 4,749,629 | 6/1988 | Sarin et al. | 428/432 |
| 4,835,062 | 5/1989 | Holleck | 428/469 |
| 5,310,603 | 5/1994 | Fukuda et al. | 428/701 |

OTHER PUBLICATIONS

Prediction of New Low Compressibility Solids; Science, vol. 245, Aug. 25, 1989, Liu and Cohen.

Structural Properties and Electronic Structure of Low–Compressibility Materials: . . . ; Physical Review B, vol. 41, No. 15, May 15, 1990–II, pp. 727–734, Liu and Cohen.

Reactive Sputtering of Carbon and Carbide Targets in Nitrogen; J. Vac. Sci. Technol. 16(2), Mar./Apr. 1979, pp. 299–302, Cuomo, Leary, Yu, Reuter and Frisch.

Structural and Optical Properties of Amorphous Carbon Nitride; Solid State Communications, vol. 65, No. 9, pp. 921–923, Man and Feldman.

Structure and Bonding Studies of the C:N Thin Films Produced by rf Sputtering Method; J. Mater. Res., vol. 5, No. 11, Nov., 1990, pp. 2490–2496, Torng, Sivertsen, Judy, Chang.

Carbon–Nitrogen Pyrolyzates: Attempted Preparation of Carbon Nitride; Communications of the American Ceramic Society, vol. 74, No. 7, pp. 1686–1688, Maya, Cole and Hagaman.

Chemical Preparation and Shock Wave Compression of Carbon Nitride Precursors; J. Am. Ceram. Soc. 73(7) vol. 23 No. 7 1990 pp. 1973–1978, Wixom.

A Graphitic Carbon Nitride, J. Mat. Sci. Letters, 9(1990), pp. 1376–1378, Sekine, Kanda, Bando, Yokoyama, Hojou.

Structure and Properties of a–C:N Films Prepared by Pulsed Excimer Laser Deposition; MRS Sym. Proc. vol. 28 (1993), pp. 1–6, Xiong, Chang and White.

(List continued on next page.)

*Primary Examiner*—Archene Turner
*Attorney, Agent, or Firm*—Banner & Witcoff, Ltd

[57] ABSTRACT

A method and apparatus for monitoring and controlling deposition of metal, insulating compounds or other compounds on a substrate by sputtering techniques includes maintaining pulsed, constant, direct current power to the target, sensing the voltage of the target material used in the process, simultaneously rapidly sensing the partial pressure of the reactive gas, and simultaneously biasing the substrate to activate the reactive gas or otherwise energizing the reactive gas in the vicinity of the substrate. Low temperature coating (eg., below 550° C.) of compounds such as alumina is effected by introduction of an extra energy source such as a radio frequency coil to the sputtering system to enhance the ionization potential of the positive ions. The asymmetric direct current pulsed magnetron power source is coupled to the cathode, as well as the substrate to be coated. An apparatus for practicing the invention is also disclosed and examples of various oxide coatings using the method of the invention are disclosed. A multilayer coating of nanometer scale layers of yttrium oxide and zirconium oxide having increased hardness is disclosed.

12 Claims, 29 Drawing Sheets

SCHEMATIC DRAWING OF NANOMETER SCALE,MULTILAYER SUPERLATTICE COATINGS

OTHER PUBLICATIONS

Properties of Carbon Nitride Thin Films Prepared by Ion and Vapor Deposition; Nuclear Instruments and Methods in Physics Research B80/81 (1993) pp. 463–466, Chubachi, et al.

Properties of Carbon Nitride Films with Composition Ratio C/N=0. 5~3.0 Prepared by Ion and Vapor Deposition (IVD) Method; Appl. Phys. 76 (1994), pp. 1–26, Ogata, et al.

Experimental Realization of the Covalent Solid Carbon Nitride; Science, vol. 261, Jul. 16, 1993, pp. 334–337, Niu, Lu and Lieber.

Observation of Crystalline $C_3N_4$; Physical Review B, vol. 49, No. 7, Feb. 15, 1994, pp. 5034–5037, Yu, Cohen, Haller, Hansen, Liu and Wu.

Physical Properties of a–C:N Films Produced by Ion Beam Assisted Deposition; J. Mater. Res., vol. 9, No. 9, Sep. 1994, pp. 2440–2449, Rossi, et al.

Carbon Nitride Deposited Using Energetic Species: A Two Phase System; Physical Review Letters, vol. 73, No. 1, Jul. 4, 1994, pp. 118–121, Marton, et al.

Ion–Assisted Laser Processing of $CN_x$ Films; Mat. Sci. and Eng. B26 (1994), pp. 49–53, Narayan, et al.

Nano–Indentation Studies of Ultrahigh Strength Carbon Nitride Thin Films; J. Appl. Phys. 74(1), Jul. 1, 1993, pp. 219–223, Li, Chung, Wong and Sproul.

Infrared Absorption and Nuclear Magnetic Resonance Studies of Carbon Nitride Thin Films Prepared by Reactive Magnetron Sputtering; J. Vac. Sci. Technol. A 12(4), Jul./Aug. 1994.

Symmetry Breaking in Nitrogen–Doped Amorphous Carbon: Infrared Observation of the Raman–Active G And D Bands; Physical Review B, vol. 39, No. 18, Jun. 15, 1989, pp. 53–60, Kaufman.

Synthesis and Characterization of Super–Wear–Resistant Carbon Nitride Coatings; Diamond Films and Technology, vol. 4, No. 2, 1994, pp. 99–111, Lin, Dravid, Chung, et al.

Composition, Structure and Tribological Properties of Amorphous Carbon Nitride Coatings, Surface Coatings Technology, 68/69 (1994) pp. 611–615, Li, Cutiongo, et al.

Nano–Indentation and Tribological Studies of Ultrahigh Strength Carbon Nitride Thin Films; Tribology Transactions, vol. 37(1994) 3, pp. 479–482, Li, Chung, et al.

Reactive Unbalanced Magnetron Sputter Deposition of Polycrystalline TiN/NbN Superlattice Coatings; Surface and Coatings Technology, 37 (1993) pp. 13–18, Chu, Barnett, et al.

Deposition and Properties of Polycrystalline TiN/NbN Superlattice Coatings; J. Vac. Sci. Technol. A 10(4), Jul./Aug. 1992, pp. 1604–1609, Chu, Wong, et al.

Characterization of the α–SN/CDTE (110) Interface by Angle–Resolved X–Ray Photoemission, Mat. Res. Soc. Symp. Proc. vol. 77 1987, pp. 247–252, Lin, Partin and Chung.

High Rate Reactive Sputtering in an Opposed Cathode Closed–Field Unbalanced Magnetron Sputtering System; Surface and Coatings Technology, 43/44 (1990) pp. 270–278, Sproul, et al.

The Effect of Target Power on the Nitrogen Partial Pressure Level and Hardness of Reactively Sputtered Titanium Nitride Coatings; Thin Solid Films 171 (1989) pp. 171–181, Sproul, et.

Mechanical Properties of Amorphous Carbon Nitride Thin Films Prepared by Reactive Magnetron Sputter–Deposition; Tribology Letters 1 (1995) pp. 87–93, Li, Chung, Wong and Sproul.

Deposition and Mechanical Properties of Superlattice Thin Films; 1993, Barnett, pp. 1–76.

Model Of Superlattice Yield Stress and Hardness Enhancements; J. Appl. Phys. 77(9), May 1, 1995, pp. 4403–4411, Chu and Barnett.

Ming Yung Chen, Growth and Characterization of $CN_x$ Thin Films, Dec., 1994, Northwestern Univ. Library.

"Ion Irradiation Effects During Growth of Mo/V(001) Superlattices by Dual–Target Magnetron Sputtering"; J. of Crystal Growth 121 (1992) pp. 399–412; Hakansson et al.

Ti/Ti–N Hf/Hf–N and W/W–N Multilayer Films with High Mechanical Hardness; Appl. Phys. Lett 61(6); Aug. 10, 1992, pp. 654–656; Shih and Dove.

Growth of Single–Crystal TiN/VN Strained–Layer Superlattices with Extremely High Mechanical Hardness; J. Appl. Phys. 62(2); Jul. 15, 1987, pp. 481–484; Helmersson, Todorova, Barnett, Sundgren, Markert and Greene.

Wavelength–Property Correlation in Electrodeposited Ultra-–structured Cu–Ni Multilayers; J. Electrochem. Soc., vol. 137, No. 2, Feb. 1990, pp. 440–444; Menezes and Anderson.

Contemporary Preparative Techniques; Physics of Thin Films; vol. 14, title page and index; Francombe and Vossen.

The Elastic and Structural Properties of Cu–Pd Superlattices; Northwestern University, Dissertation by Bradley Marc Davis.

Elastic and Nanostructural Properties of Cu/Pd Superlattices; J. Mater. Res., vol. 7, No. 7, Jun. 1992; pp. 1356–1369; Davis, Li, Seidman, Ketterson, Bhadra and Grimsditch.

An Ultrahigh Vacuum, Magnetron Sputtering System for the Growth and Analysis of Nitride Superlattices; J. Vac. Sci. Technol.A 10(1), Jan./Feb. 1992; pp. 75–81; Mirkarimi, Shinn and Barnett.

Growth, Structure, and Microhardness of Epitaxial TiN/NbN Superlattices; J. Mater. Res., vol. 7, No. 4, Apr. 1992; pp. 901–911; Shinn, Hultman and Barnett.

Deposition and Properties of Polycrystalline TiN/NbN Superlattice Coatings; J. Vac. Sci. Technol. A 10(4), Jul./Aug. 1992; pp. 1604–1609; Chu, Wong, Sproul, Rhode and Barnett.

Cross–section Preparation for TEM of Film–Substrate Combinations with a Large Difference in Sputtering Yields; J. Elec. Micro. Techn., 1986, pp. 361–369; Helmersson and Sundgren.

The Effect of Target Power on the Nitrogen Partial Pressure Level and Hardness of Reactively Sputtered Titanium Nitride Coatings; Thin Solid Films, 171 (1989) pp. 171–181; Sproul, Rudnik and Gogol.

High Rate Reactive Sputtering Process Control; Surface and Coatings Tech., 33 (1987) pp. 73–81; Sproul.

Growth and Properties of Single Crystal TiN Films Deposited by Reactive Magnetron Sputtering; J. Vac. Sci. Technol. A 3(2), Mar./Apr. 1985; pp. 303–307; Johansson, Sundgren, Greene, Rockett and Barnett.

Structure of Chemically Modulated Films, Synthetic Mod. Stru.; 1985, pp. 43–74; McWhan.

The Effects of Sputter Angle and Ion Beam Voltage on Interface Resolution of a Calibrated Cr/Ni Multilayer Sample; Assoc. Lab. Sci.; Mary Gorman.

Long Journey into Tunneling; Science; Vo. 183, No. 4130, Mar. 22, 1974; pp. 1149–1155; Esaki.

The Effects of $N_2$ Partial Pressure, Deposition Rate and Substrate Bias Potential on the Hardness and Texture of Reactively Sputtered TiN Coatings; Surface and Coatings Tech. 39/40 (1989), pp. 355–363; Sproul, Rudnik and Graham.

Microstructural and Microchemical Characterization of Hard Coatings; J. Vac. Sci. Technol. A 4(6), Nov./Dec. 1986, pp. 2770–2783; Sundgren, Rockett, Greene and Helmersson.

Residual Stress in Physically Vapor Deposited Films: A Study of Deviations from Elastic Behavior; Thin Solid Films, 171(1989), pp. 197–216; Perry and Jagner.

Effect of Periodic Chemical Variation on the Mechanical Properties of Ta Foils[a]; J. Vac. Sci. Technol., 16(3), May/Jun. 1979, pp. 878–881; Springer, Ott and Catlett.

Very High Rate Reactive Sputtering of TiN, ZrN and HfN; Thin Solid Films, 107 (1983), pp. 141–147; Sproul.

Advances in Partial–Pressure Control Applied to Reactive Sputtering; Surface and Coatings Tech., 39/40 (1989), pp. 499–506; Sproul, Rudnik, Gogol and Mueller.

Enhanced Hardness in Lattice–Matched Single–Crystal TiN/$V_{0.6}Nb_{0.4}N$ Superlattices; Appl. Phys. Lett. 57(25), Dec. 17, 1990, pp. 2654–2656; Mirkarimi, Hultman and Barnett.

Microstructure Modification of TiN by Ion Bombardment During Reactive Sputter Deposition; Thin Solid Films, 169 (1989), pp. 299–314; Petrov, Hultman, Helmersson, Sundgren and Greene.

The Effect of Target Power on the Nitrogen Partial Pressure Level and Hardness of Reactively Sputtered Titanium Nitride Coatings; Thin Solid Films 171 (1989), pp. 171–181; Sproul, Rudnik and Gogol.

Hafnium Nitride Coatings Prepared by Very High Rate Reactive Sputtering; Metallurgical and Protective Coatings; Sproul.

Reactively Sputtered Doped Hafnium Nitride Coatings; Surface and Coatings Techn., 36 (1988), pp. 191–198; Sproul.

Microstructure and Physical Properties of Polycrystalline Metastable $Ti_{0.5}Al_{0.5}N$ Alloys Grown by D.C. Magnetron Sputter Deposition; Thin Solid Films, 153, (1987), pp. 55–65; Hakansson, Sundgren, McIntyre, Greene and Munz.

Titanium Aluminum Nitride Films: A New Alternative to TiN Coatings; J. Vac. sci. Technol. A 4(6), Nov./Dec. 1986, pp. 2717–2725; Munz.

On Structure and Properties of Sputtered Ti and Al Based Hard Compound films; J. Vac. Sci. Technol. A 4(6) Nov./Dec. 1986, pp. 2695–2700; Knotek, Bohmer and Leyendecker.

Mechanical Property and Structure Relationships in Hard Coatings for Cutting Tools; J. Vac. Sci. Technol. A 6(3), May/Jun. 1988, pp. 2149–2157; Quinto.

Structure–Property Relationships in Microlaminate TiC/$TiB_2$ Condensates; Thin Solid Films, 97 (1982); Movchan, Demchishin, Badilenko, Bunshah, Sans, Deshpandey and Doerr.

High Rate Reactive Sputtering in an Opposed Cathode Closed–Field Unbalanced Magnetron Sputtering System; Surface and Coating Techn., 43/44 (1990), pp. 270–278; Sproul, Rudnik, Grahm and Rhode.

Tables (9 pages) 25–1361 to 39–1398.

Formation of Polyhedral Voids at Surface Cusps During Growth of Epitaxial TiN/NbN Superlattice and Alloy Films; J. Vac. Sci. Technol. A 10(4), Jul./Aug. 1992, pp. 1618–1624; Hultman, Wallenberg, Shinn and Barnett.

High Rate Thick Film Growth; Ann. Rev. Mater. Sci. 1977, pp. 239–261; Thorton.

Multi–Cathode Unbalanced Magnetron Sputtering Systems; Surface and Coatings Techn. 49 (1991), pp. 284–289; Sproul.

Modeling Magnetic Fields of Magnetron Sputtering Systems; Surface and Coatings Techn. 49 (1991), pp. 121–126; Wong, Sproul and Rohde.

Dual–Unbalanced Magnetron Deposition of TiN Films; Surface and Coatings Techn. 50 (1992), pp. 255–262; Rohde, Hultman, Wong and Sproul.

Don't Let Poisoning Slow You Down, Use Feedback Controls; Research & Development, Nov. 1989, 4 pages; Sproul, Rudnik and Gogol.

Technology Bulletin; Reducing Wear in Machines; 4 pages, BIRL.

BIRL Progress, Jun. 1991, 6 pages.

FIG.1 SCHEMATIC OF SPUTTERING SYSTEM

ASYMMETRIC BIPOLAR PULSED DC POWER

SOURCE: J SELLERS, "ASYMMETRIC BIPOLAR PULSED DC" ENI TECH NOTE, ENI, ROCHESTER, NY

AlO$_x$ – TARGET VOLTAGE VS. OXYGEN PARTIAL PRESSURE

SCHEMATIC DRAWING OF THE DEPOSITION SYSTEM USED TO DEPOSIT THE NANOMETER-SCALE, MULTILAYER SUPERLATTICE COATINGS

SCHEMATIC DRAWING OF NANOMETER SCALE, MULTILAYER SUPERLATTICE COATINGS

5,789,071

MULTILAYER OXIDE COATINGS

CROSS REFERENCE TO RELATED APPLICATION

This is a continuation in part application of the following co-pending or parent U.S. patent applications for which priority is claimed with respect to any common subject matter:

| Title | Ser. No. | Filing Date | Inventors | Ap Status |
|---|---|---|---|---|
| Polycrystalline Superlattice Coated Substrate and Method and Apparatus For Making Same | 07/973,390 | Nov. 9, 1992 | Scott A. Barnett William D. Sproul Ming-Show Wong Xi Chu | abandoned |
| Superhard Composite Materials Including Compounds of Carbon and Nitrogen Deposited on Metal and Metal Nitride, Carbide, and Carbonitride | 08/388,020 | Feb. 14, 1995 | William D. Sproul Ming-Show Wong Xi Chu Scott A. Barnett Dong Li Yip-Wah Chung | allowed |
| Method For Sputtering Compounds On a Substrate | 08/635,472 | June 14, 1996 | William D. Sproul Michael E. Graham | pending |
| Method For Magnetron Sputtering Alumina and Other Compounds Onto A Substrate | 08/675,797 | July 5, 1996 | William D. Sproul Jochen M. Schneider | allowed |

CONTRACTUAL ORIGIN OF THE INVENTION

This invention was supported, at least in part, by the U.S. Air Force Office of Scientific Research Grant No. F49 620-95-1-0177 wherefore the U.S. Government may have certain rights in the invention.

BACKGROUND OF THE INVENTION

Briefly, the present invention relates to a method and apparatus for sputtering of a thin film of a compound onto a substrate work piece by means of cathodic, magnetron sputtering, and to one product of such techniques; namely, multilayer oxide films having hardness characteristics significantly greater than the hardness of the materials in each layer.

Application of metals and metallic compounds by use of a reactive deposition process is known and is the subject, for example, of U.S. Pat. No. 4,428,811, "Rapid Rate Reactive Sputtering Of A Group IVB Metal" issued Jan. 31, 1984, incorporated herewith by reference. U.S. Pat. No. 4,428,811 discloses a method and apparatus for rapid rate deposition of metallic compounds such as titanium nitride onto a substrate in a vacuum chamber. In the process, the chamber is filled with inert gas that is ionized and bombards the metal target within the chamber to initiate the sputtering process. A substrate to be coated is positioned within the chamber and a second reactive gas is fed into the chamber at a measured rate to combine with the atomized metal from the target and form a coating on the substrate. Control systems for such sputtering operations are also disclosed in the aforesaid patent.

Over the years, the technology associated with sputtering processes has been improved so that additional compounds and materials can be applied to a substrate thereby. A series of papers by the co-inventor reflect research in this area including the following:

1. "High Rate Reactive Sputtering Process Control," published in *Surface and Coatings Technology*, 1987;
2. "The Effect of Target Power on the Nitrogen Partial Pressure Level and Hardness of Reactively Sputtered Titanium Nitride Coatings," published in *Thin Solid Films*, 1989;
3. "Advances in Partial-Pressure Control Applied to Reactive Sputtering," published in *Surface and Coatings Technology*, 1989;
4. "The Effect of $N_2$ Partial Pressure, Deposition Rate and Substrate Bias Potential on the Hardness and Texture of Reactively Sputtered TiN Coatings," published in *Surface and Coatings Technology*, 1989;
5. "Deposition and Properties of Polycrystalline TiN/NbN Superlattice Coatings," published in *J. Vac. Sci. Technol.* A 10/4, July/August 1992; and
6. "Control of a Reactive Sputtering Process for Large Systems," a paper presented at the Society of Vacuum Coaters, 36th Annual Technical Conference, Dallas, Tex., Apr. 30, 1993.

The text of these publications is incorporated herewith by reference.

The energy source which effects the ionization of the inert gas in a sputtering system has evolved over time so that now pulsed, direct current electrical power is known to be a preferred energy source to the target material. Publications relating to this technique and technology include the following:

7. "Mechanisms of Voltage Controlled, Reactive, Planar Magnetron Sputtering of Al in $Ar/N_2$ and $Ar/O_2$ Atmospheres," published in *J. Vac. Sci. Technol.* A 2(3), July–September 1984; and
8. "Pulsed Magnetron Sputter Technology," published in *Surface and Coatings Technology*, 1993.

These publications are incorporated herewith by reference.

Sputtering techniques for the application of pure metals are fairly well refined and effective. Additionally, sputtering techniques for conductive or non-insulating compounds have been somewhat successful utilizing the techniques described in the aforesaid publications. However, certain materials, which provide an insulating, hard coating upon a substrate are difficult to apply as a film or may not be efficiently applied using such sputtering techniques. Aluminum oxide, for example, has heretofore been applied by sputtering techniques to a substrate at only a small fraction of the rate and efficiency of the application associated with pure aluminum metal. Thus, low deposition rates of insulating or non-conductive metal compounds have continued to pose a challenge. Publications that reflect research regarding the sputtering of such compounds include the following, which are incorporated herewith by reference:

9. "Aspects and Results of Long-Term Stable Deposition of Al$_2$O$_2$ with High Rate Pulsed Reactive Magnetron Sputtering," published in *Surface and Coatings Technology*, 1993;

10. "Reactive Direct Current Magnetron Sputtering of Aluminum Oxide Coatings," *J. Vac. Sci. Technol.* A 13(3), May/June 1995; and 11. "Reactive DC Magnetron Sputtering of the Oxides of Ti, Zr, and Hf ," presented at the International Conference on Metallurgical Coatings and Thin Films, Town and Country Hotel, San Diego, Calif., Apr. 24–28, 1995, and accepted for publication in *Surface and Coatings Technology*.

Recent reported research suggests that alumina (Al$_2$O$_3$) can be coated on a substrate over a wide range of temperatures. See "Pulsed Magnetron Sputtering of Alumina Films: Crystalline Phases At Low Temperatures," Fietzke et al., Supplement Les Vide science, technique et applications, No. 279, January, February, March, 1996, pp. 218–220. However, the reported results indicate that the techniques involved produce an amorphous alumina coating on the substrate when the described process is conducted at less than 550° C. As a result, the coating techniques described are not useful for coating many substrate materials such as tool steel with a hard, crystalline coating. This follows since substrate materials such as tool steel may degrade or become non-utilitarian when exposed to temperatures over 500° C.–550° C. Of course, coating such materials with a stable or meta stable crystalline coating is nonetheless desired since such coatings may be hard and protective whereas amorphous coatings are generally neither hard nor protective.

In the article titled, "Metal Ion Deposition from Ionized Magnetron Discharge," Rossnagel et al. in J.Vac. Sci. Technology Bulletin, Vol. 12 (1) January/February 1994, disclose a process for metal ion deposition at substrate temperatures in the range of 300° C.–600° C. Materials such as copper, aluminum copper and Ti/TiN are disclosed as applied in a crystalline form to a substrate. The equipment utilized for the coating process includes a radio frequency induction coil to enhance the coating operation. Though such techniques appear to be useful for coating substrates at lower temperatures with pure metals or materials and certain limited compounds, nonetheless, there remains a need to provide for crystalline coatings of compounds such as alumina at temperatures below 500° C.–550° C.

In sum, there has remained a need to provide an improved method and apparatus for the deposition of metallic, insulating compounds such as aluminum oxide and other compounds in a stable or meta-stable form at temperatures below 500° C.–550° C., on a substrate using sputtering techniques. Additionally, there has remained a need to provide multiple layer coatings of materials, such as oxides, wherein the adjacent layers are coated as distinct compositions and wherein the effect of utilizing dissimilar adjacent coating layers results in increased hardness of the multilayer coating relative to the hardness of material comprising a single layer.

SUMMARY OF THE INVENTION

In a principal aspect, the present invention comprises a method for deposition of various compounds, especially insulating, metallic compounds such as aluminum oxide and other oxides, on a substrate as a thin film by sputtering techniques utilizing a pulsed, constant power, direct current electric power supply to cause ionization of an inert gas that bombards a target thereby releasing the atoms of the target into a vacuum chamber and further controlling the rate of admission and thus the reaction of a second, reactive gas to the chamber with a combination of control signals. Specifically, the rate of admission is controlled by a first signal derived from the measured voltage of the target which is maintained at a constant power setting. The rate of admission is further controlled by a second signal derived from the measured partial pressure of the reactive gas. The partial pressure of the reactive gas is sensed by means such as an optical gas controller or mass spectrometer as the target voltage is sensed to provide control signals representative of the desired composition and physical characteristics of the thin film. The desired composition and physical characteristics are derived empirically for given target materials, reactive gases and power settings. To further enhance the thin film deposition process, the reactive gas at or near the substrate is subjected to local energy input, for example, by applying pulsed direct current to the substrate. By the method, it is possible to carefully control the amount of reactive gas in the system and thereby increase the rate of deposition of the compound multiple times the rate of deposition using prior sputtering techniques.

As a further aspect of the invention, crystalline compound coatings may be effected at temperatures less than 500° C.–550° C. on substrate materials such as tool steel and other materials which otherwise may degrade or lose their integrity at higher temperatures. The range of substrate materials that may be coated is thus significantly expanded.

The types of coatings is likewise expanded and generally includes materials which may be in the form of positive ions, such as metals, and materials which may be in the form of negative ions such as oxygen and other reactive gases. The coatings are applied utilizing a pulsed, direct current magnetron power supply, which is preferably asymmetric and wherein the substrate being coated is negatively biased between about –10 volts and –500 volts and further wherein the current density on the substrate is in the range of about 1 milliamp/cm$^2$ to 30 milliamps/cm$^2$ or higher and wherein the substrate current density is augmented or enhanced by introduction of an energy source to increase the ionization energy of the ions in the system, for example, by a radio frequency (rf) coil positioned intermediate the target and the substrate. Consequently, the positive ions have enhanced ionization energy in the system due to the techniques utilized. The resulting coating is a crystalline compound, may be formed at temperatures below about 500° C.–550° C., is formed from positive and negative ion materials generated in the system, has enhanced hardness, is generally stoichiometric, and is the result of utilizing pulsed, direct current power supplied synchronously or asynchronously to the cathode and substrate.

As a further aspect of the invention, deposition of nanometer scale, multilayer, oxide films may be effected. For example, a multilayer, superlattice array of films of yttrium (Y$_2$O$_3$) and zirconium oxide (ZrO$_2$) may be reactively deposited simultaneously (or sequentially) utilizing apparatus of the general type described and, more particularly, apparatus using opposed-cathode, unbalanced magnetron sputtering. Thus, two oxide materials may be deposited in alternate layers in the same deposition chamber or operation. Deposition may occur on substrates, such as glass or silicon, although other materials may be utilized as a substrate. The substrates are typically mounted on a substrate holder which is rotated between two cathodes on opposite sides of the deposition chamber. As the substrate passes in front of a zirconium target, for example, a thin nanometer scale layer of zirconium oxide is deposited. Then as the holder rotates 180° and passes in front of a yttrium target, for example, a thin nanometer scale layer of yttrium oxide is deposited on top of the zirconium oxide layer. The thickness of each layer is typically in the range of one to five nanometers. The thickness is determined by the speed of substrate rotation, for example. Other factors affecting thickness include the power to each metal target, the partial pressure of the reactive gas (oxygen) and other features discussed. Multiple layers are built up by continued rotation of the substrate until the total thickness of the multilayer deposition is in the range of at least three or more micrometers.

Thus, it is an object of the invention to provide an improved method and apparatus for deposition of compounds on a substrate by sputtering techniques.

Another object of the invention is to provide an improved and highly efficient method and apparatus for deposition of insulating, metal compounds on a substrate utilizing improved control techniques.

It is a further object of the invention to provide an improved method for deposition by sputtering of compounds including oxides, nitrides, fluorides, sulfides, chlorides, borides and mixtures thereof.

Another object of the invention is to provide an improved method for deposition of thin films of insulating, metal compounds on a substrate at rates which are multiples of the rates of prior art sputtering techniques.

Another object of the invention is to provide an improved method for deposition of metal and semi-conductor compounds as thin films using sputtering techniques.

A further object of the invention is to provide a method for effecting efficient deposition of compounds by sputtering techniques utilizing a constant power, pulsed direct current power supply for the target material and control signals for controlling the admission of reactive gas wherein one signal is reflective of the voltage of the target power source and another signal is reflective of the partial pressure of the reactive gas used.

Yet a further object of the invention is to provide a multilayer film of metal oxides which has increased hardness vis a vis the hardness of material forming the single oxide layers.

Yet a further object of the invention is to provide a multilayer superlattice film of yttrium oxide and zirconium oxide wherein each of the layers have a thickness of zero to ten nanometers with the thickness of each separate layer being in the range of one to six nanometers.

Another object of the invention is to provide a crystalline coated article, such as a tool steel article, coated by a hard material, such as alumina, at a temperature less than about 500° C. –550° C.

Another object of the invention is to provide a method for coating various substrate materials with a compound in crystalline form utilizing pulsed direct current power with an asymmetric wave form wherein the substrate being coated is negatively biased between about –10 volts and –500 volts.

Another object of the invention is to provide a coating process using pulsed direct current power wherein the power is applied to the cathode and substrate simultaneously and synchronously.

A further object of the invention is to provide a pulsed direct current, asymmetric wave form magnetron sputter coating process enhanced by the introduction of energy to the ionized particles in the system by various means, including a radio frequency coil, a hot filament, a laser source and other means.

Another object of the invention is to provide pulsed, direct current magnetron sputter coating wherein reactive gases are introduced into the system in amounts to sustain formation of stoichiometric crystalline compound coating layers on a substrate.

These and other objects, advantages and features of the invention will be set forth in the detailed description as follows.

BRIEF DESCRIPTION OF THE DRAWING

In the detailed description which follows, reference will be made to the drawing comprised of the following figures.

DESCRIPTION OF THE PREFERRED EMBODIMENT

Overview And General Description

Figure 1:
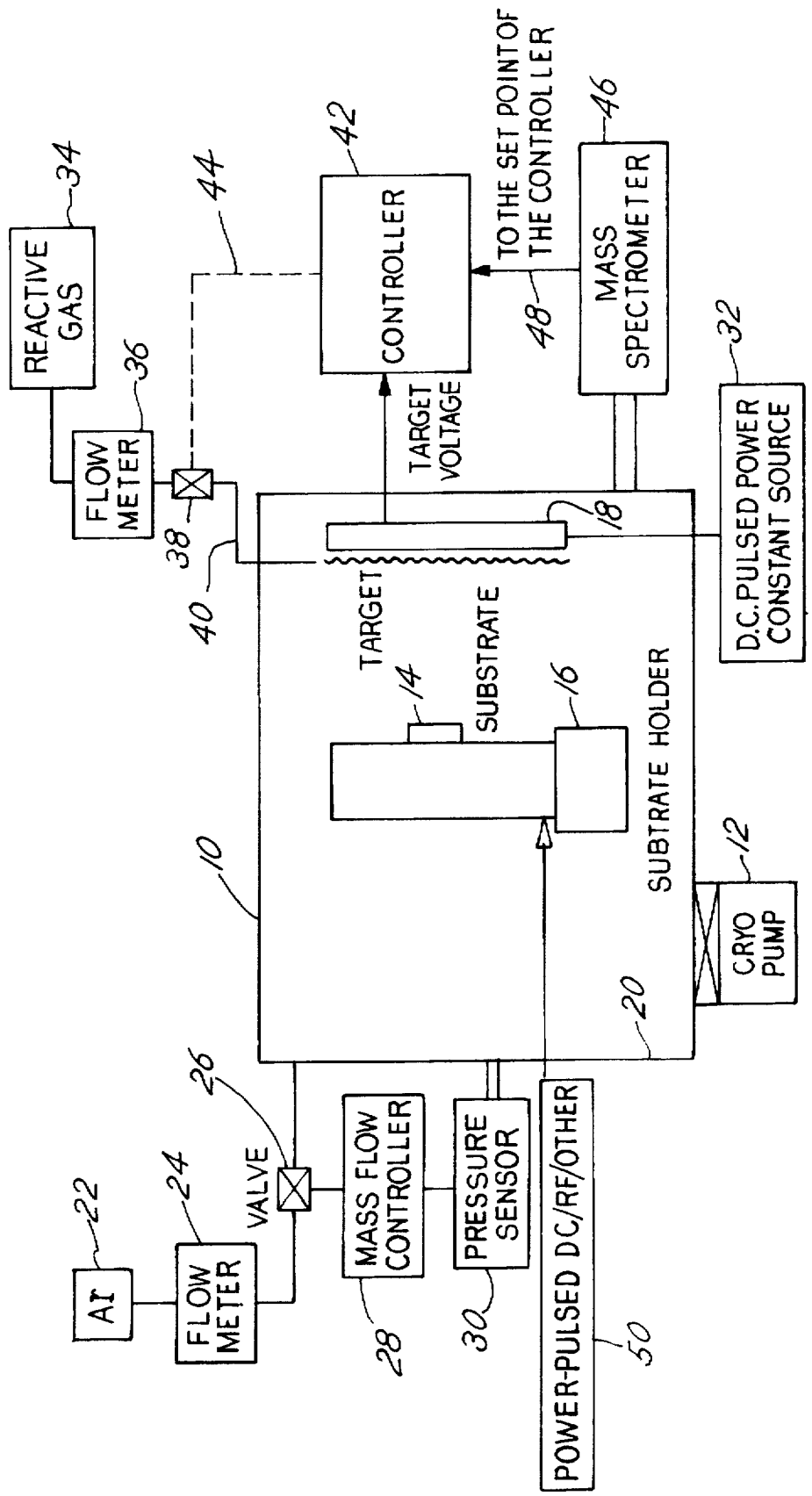
FIG. 1 is a schematic of a vacuum chamber and the control circuitry associated therewith for the practice of a method of the invention.

The method of the invention as well as the associated apparatus as reflected in FIGS. 1–5 are designed to optimize the conditions for reaction between atomized target material and reactive gas to form and deposit a thin film compound in a sputtering system. The method, system and article of manufacture of FIGS. 6–17 relate to sputtering of crystalline compounds at relatively low temperatures (i.e., below 550° C.) utilizing many of the techniques of the embodiment of FIGS. 1–5 plus some additional features. Thus referring to FIG. 1, there is depicted the component parts of a sputtering system used to practice the invention.

A vacuum chamber 10 is evacuated by a pump 12 after a substrate material 14, e.g. quartz or a piece of steel is mounted on a holder 16 within the chamber 10. A target material 18, e.g. aluminum or some other metal or semiconductor material, is also mounted within the chamber 10. The target 18 serves as a cathode in the process and the inside walls 20 of chamber 10 serve as an anode. An inert gas, e.g. Argon (Ar), is admitted to chamber 10 from a source 22 via a meter 24 and valve 26 controlled by a controller 28 responsive to a pressure sensor 30.

Figure 2:
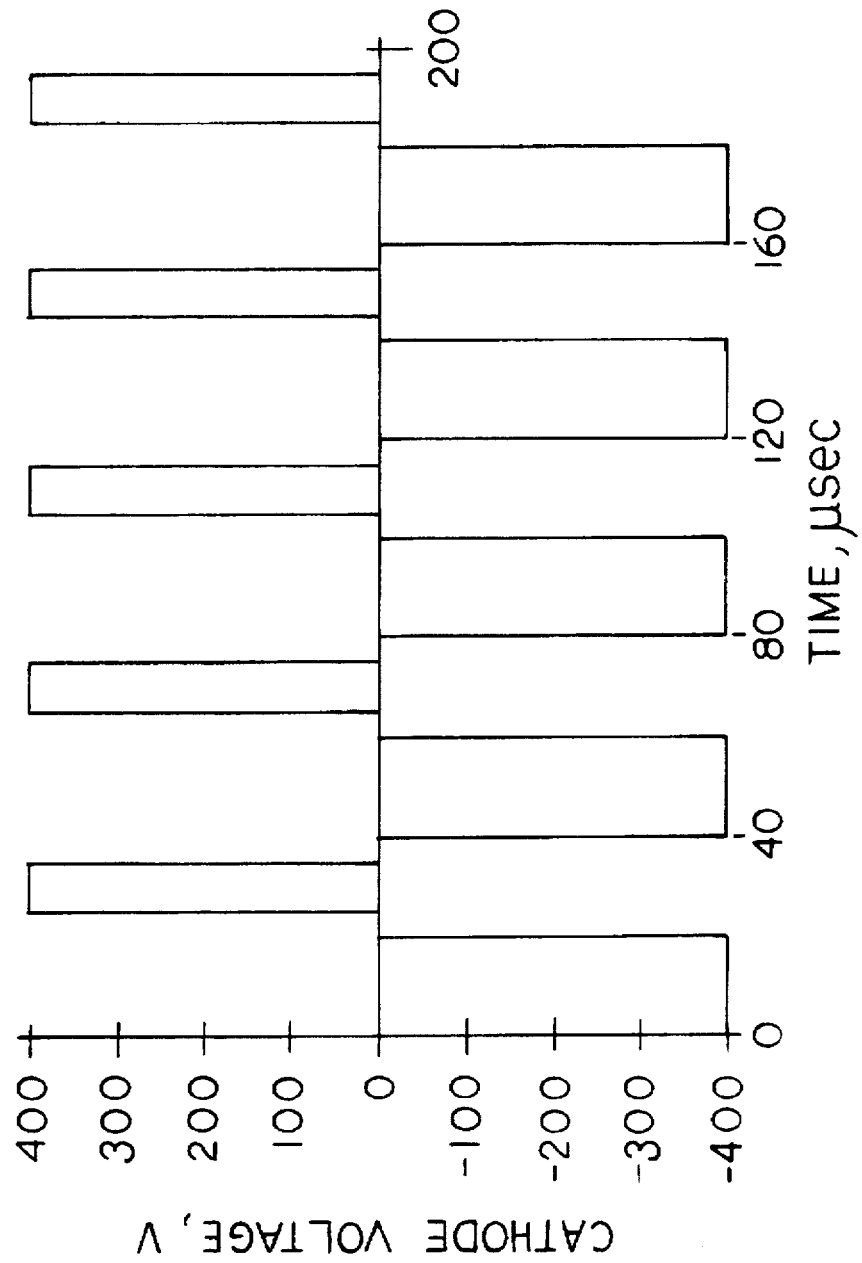
FIG. 2 is a graph depicting a symmetric, bipolar pulsed, direct current power supply wave.
Figure 3:
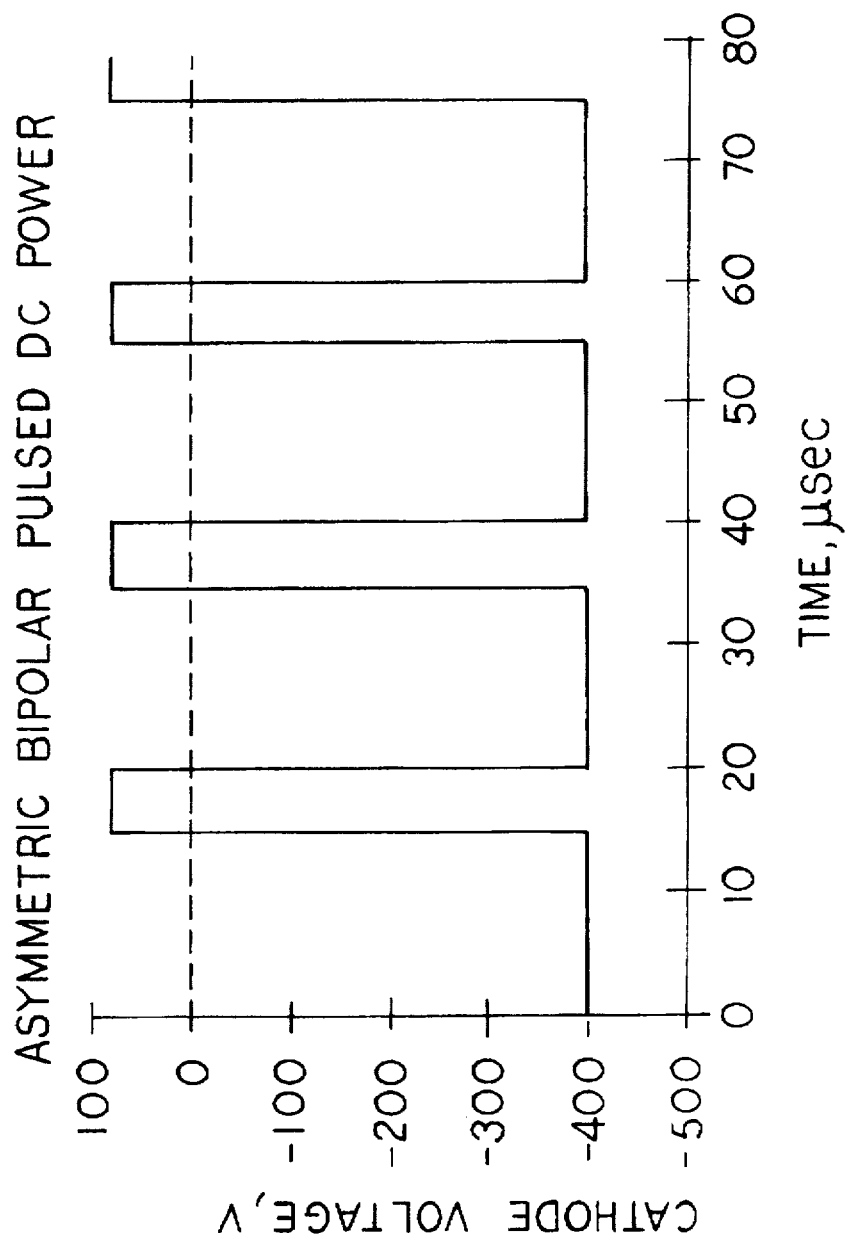
FIG. 3 is a graph depicting an asymmetric, bipolar pulsed direct current power supply wave.

The target 18 is subject to a bipolar, pulsed, direct current power source 32 of the type generally known in the art. The source 32 is preferably asymmetric as depicted in FIG. 3 with the cathode negatively biased on the average, although a symmetric source 32, as depicted in FIG. 2, may be utilized.

A reactive gas, such as oxygen, is provided from a source 34 through a flow meter 36 and control valve 38 via a conduit 40 to the vicinity of the target 18 where its proximity to atoms from the target will enhance reaction therewith. The reactive gas control valve 38 is responsive to a plurality of sensing or feedback signals which are input to a controller 42 which, upon proper processing, provides a control signal via link 44 to valve 38.

Figure 4:
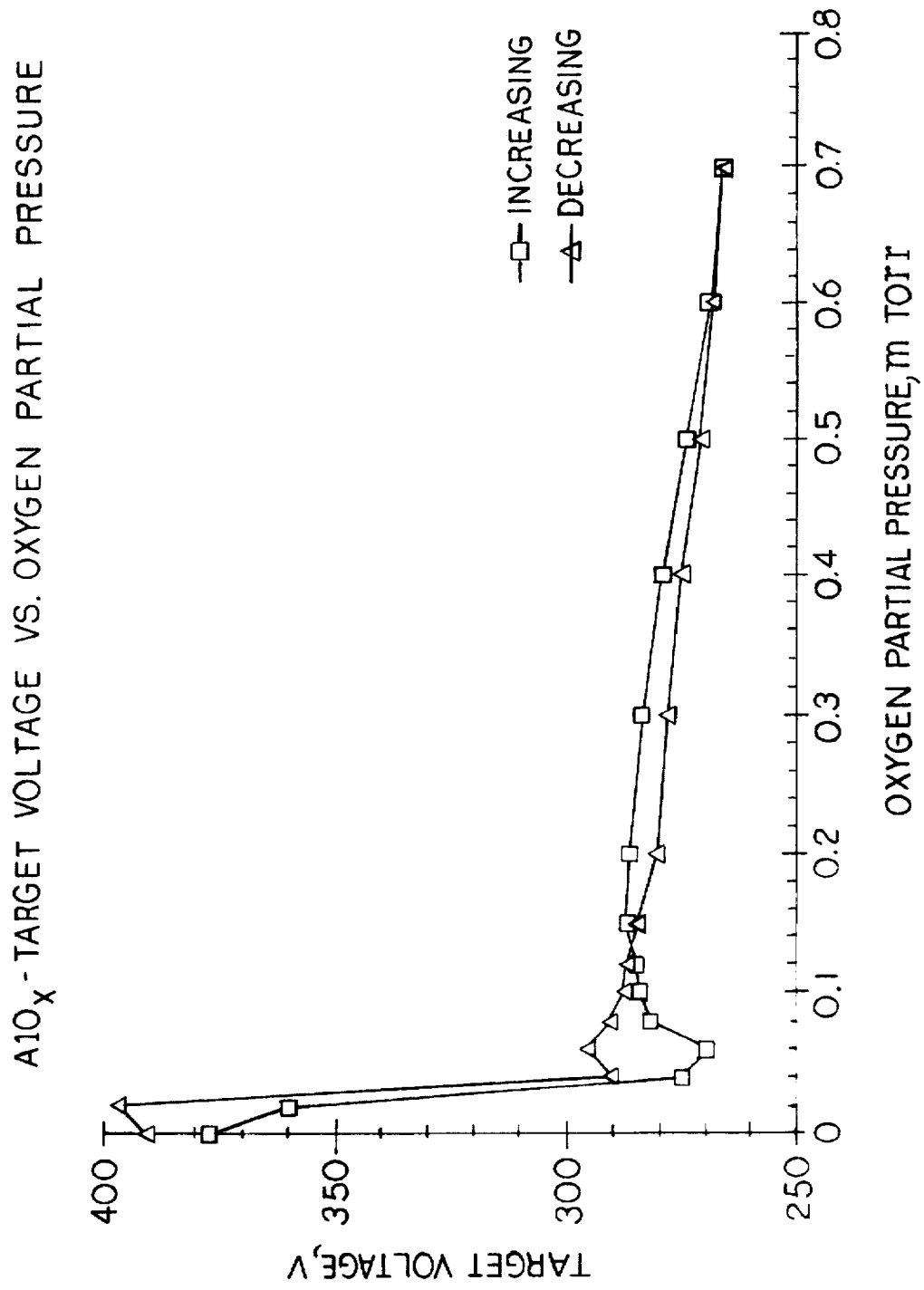
FIG. 4 is a graph depicting the target voltage/oxygen partial pressure hysteresis curve for the reactive sputtering of aluminum in an argon/oxygen atmosphere.

The signals to the controller 42 are derived from two sources, first the voltage of the target 18 is constantly monitored. Second, the partial pressure of the reactive gas is monitored. Regarding the voltage target 18, this voltage may vary since the power to the target 18 is maintained at a constant value. For each set of conditions within the chamber, therefore, for a given target and reactive gas, it is possible to derive the relationship between such constant power voltage and the partial pressure of the reactive gas thereby identifying the optimal range of partial pressure and voltage for formation of the compound comprised of the target material and reactive gas. An example of this empirical derivation is depicted in FIG. 4 for a target material of aluminum in an argon/oxygen atmosphere for increasing and decreasing oxygen partial pressure wherein the target power was 2 kilowatts from a 20 $kHz_3$ pulsed direct current source and the total chamber pressure was 4 mTorr. Note that partial pressure of about 0.03 mTorr at a target voltage of 270 to 380 volts is indicative of highly efficient film formation. This information or information of this type is derived from an experimental or test run, and the results are programmed into controller 42 thus enabling the controller 42 the capability to provide almost instantaneous feedback control input because voltage measurements provided to the controller 42 from target 18 are inherently rapid. Thus, the voltage feedback signal provides a highly sensitive, rapid response, control function, when empirical or full range test run, hystersis information derived from an experiment or full range test run of the type reflected by FIG. 4 is programmed into the controller 42.

Simultaneous with the rapid control signal derived from the voltage of target 18, a second less rapid signal is derived by directly measuring the partial pressure of the reactive gas, e.g. oxygen. Thus, as depicted in FIG. 1, a mass spectrometer 46, for example, or a partial pressure controller, e.g. an analyzer (OGC made by Leybold Infilon of East Syracuse, N.Y.) is provided to determine the partial pressure of the specific reactive gas. Note the signal derived from sensor 46 is species specific, e.g. oxygen; whereas the target voltage signal is not. Thus, the target voltage signal, previously described, may result, at least in part, due to phenomena other than the partial pressure of the reactive gas. For example, out gassing from the substrate or chamber walls may have an impact on the signal. Thus, the reactive gas sensor 46 provides a signal 48 to the controller which is reflective of the true partial pressure of the reactive gas (oxygen) albeit a slowly developed or slowly derived signal relative to the target voltage signal because of the instrumentation involved.

Figure 5:
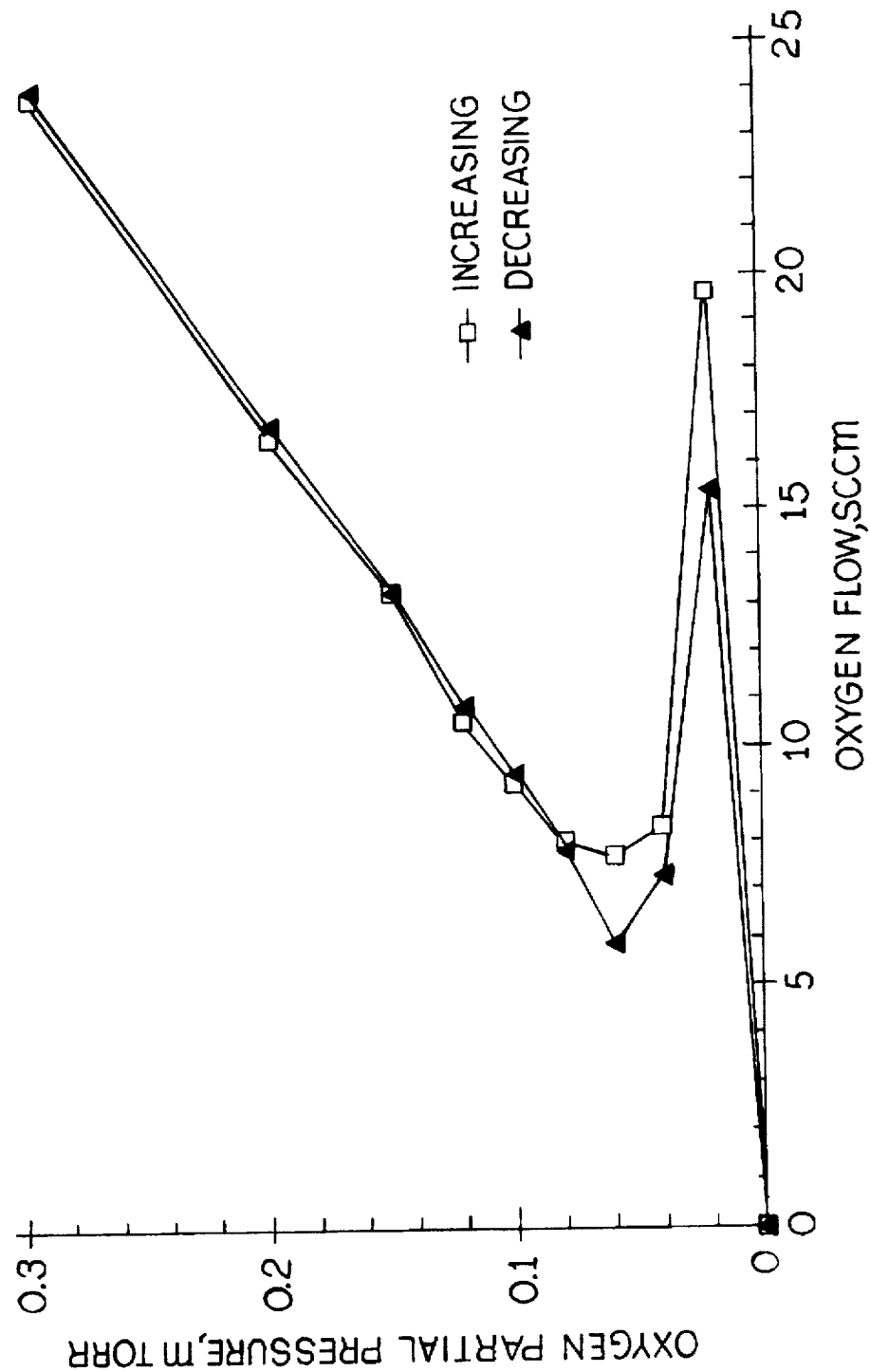
FIG. 5 is a graph depicting the oxygen reactive gas flow/oxygen partial pressure hysteresis curve for the reactive sputtering of aluminum in an argon/oxygen atmosphere.

In any event, the meaning of the signal 48 is also dependent upon the empirical relationship between reactive gas partial pressure and flow rate. This relationship is derived simultaneously with the empirical power voltage/ partial pressure relationship discussed with regard to FIG. 4 for each specific set of conditions. FIG. 5 is a graph depicting the relationship for the same conditions (in fact, derived during the same empirical experimental run) as FIG. 4.

Referring to FIG. 5, for the reported conditions and materials, which is the same as specified for the data of FIG. 4, the optimal partial pressure is in the range of about 0.02 mTorr, at which point the oxygen flow is in the range of 15 to 20 Sccm. Thus, the signal 48 from sensor 46 can be utilized to "zero" or set the controller 42 so that the target voltage signal to controller 42 is working from an appropriate base line.

One farther input to the system is provided to enhance the film deposition process. An energy source 50 provides a means for activating the reactive gas, e.g., oxygen, at or near the substrate 14. For example, a pulsed direct current power supply may be applied to the substrate 14. Other energy sources include a radio frequency voltage source, lasers, electron beams, a microwave source, or an inductively coupled plasma source. A radio frequency source of 13.56 MHZ or a harmonic multiple thereof may be used (per governmental mandate and restrictions). The energy input at the substrate 14 has the effect of enhancing the process efficiency as reflected by the data derived in FIGS. 4 and 5, by way of example, so as to increase flow rate and voltage at optimal conditions, and thus deposition rate.

Referring to the arrangement of FIG. 1, by correlating the data of the type derived in FIGS. 4 and 5 with various physical parameters of the film compound, it becomes possible to apply films having customized characteristics. For example, each of the data points of FIGS. 4 and 5 are representative of compounds having associated therewith a variety of measurable physical characteristics including conductivity, modulus, hardness, extinction coefficient, index of refraction, reflectivity, transmission and constituent composition. By controlling the sputtering process to such data points, as it is possible to do with this process, the desired custom film may be sputter applied to a substrate 14.

The process is especially useful in the deposition of insulating, metal compounds such as aluminum oxide. Experimental results demonstrate application rates 15 to 20 times better than prior techniques. For example, with the reactive sputtering of stoichiometric $Al_2O_3$, the deposition rate had been increased from about 5% of the metal deposition rate to 70% or more of the metal deposition rate. Also, the process is useful with many compounds including oxides, nitrides, carbides, sulfides, fluorides, chlorides, borides and mixtures thereof. Numerous metals, including aluminum, titanium, hafnium, zirconium, tantalum, silicon, and chromium have been successfully used as the target material.

Following is a specific example of the practice of the invention utilizing the arrangement depicted in FIG. 1:

Example of Deposition of Aluminum Oxide by Means of Reactive DC Sputtering

Aluminum oxide (stoichiometric composition but non-crystalline) may be deposited using the following deposition system hardware:

The substrate to be coated is placed in a stainless steel vacuum chamber, approximately 29" o.d. and about 30" high, which is electrically grounded to earth potential and is pumped with a 6" diffusion pump and a 1500 l/s turbomolecular pump, which are both backed up with appropriately sized mechanical pumps (in this case, Edwards EM2-80's) capable of achieving a base pressure of $1\times10^{-6}$ Torr.

The substrate may be a flat glass slide or other material of choice, which is mounted on the 5"-diameter, rotatable substrate table. The closest approach of the substrate to the target is about 3" and it may be rotated or held stationary during coating.

Two nominally 5"×15" rectangular MRC Inset targets are mounted vertically, opposing one another about 11" apart with the substrate table in between. The cathodes are an unbalanced magnetron design, which enhances the plasma density in the vicinity of the substrate, and at least one target is aluminum with a metallic purity of at least 99.99%.

The cathodes (targets) are each connected to Advanced Energy MDX 10 kW dc power supplies through 20 kHz Sparc-Le (or higher frequency) units which together provide a pulsed dc power and suppression of arcing on the target surface during sputtering.

The substrate table is connected to a 3 kW rf power supply, and the induced dc voltage is read out through a meter which is shielded from rf power by means of an appropriate filter.

The total gas pressure in the chamber is monitored by a Baratron (capacitance manometer) for sputtering pressures (1–10 mTorr), and lower pressures are monitored with a Bayard-Alpert type ionization gauge. The ionization gauge is also used as a reference in checking the calibration of the partial pressure sensors (OGC or mass spec.), or a more stable instrument such as a spinning rotor gauge can be used and is preferred if available.

The partial pressures of all gases in the system are monitored with an Inficon Quadrex 100, quadrupole mass spectrometer, and two of the gases (oxygen and argon) are monitored with an Ifficon OGC (Optical Gas Controller). The mass spectrometer is attached to a sampling system which is differentially pumped, since it requires an operating pressure that is typically in the $10^{-6}$ Torr range, and is mounted to the top of the chamber. The OGC is attached directly to the back of the chamber through a standard KF flange, since it operates at sputtering pressures.

The gas flow controllers are MKS model 260 with modifications that allow them to respond to pressure signals instead of flow signals. In this case, the total pressure is maintained constant by a feedback control involving the Baratron and the MKS controller. The target voltage on the aluminum target is used as the primary indicator of oxygen partial pressure during sputtering and is used as a feedback signal to the MKS controller which operates the inlet valve for a quick response to any deviations in partial pressure (voltage). Since the voltage is not a unique signal with respect to the partial pressure of oxygen, the OGC or the mass spectrometer is used to provide a feedback signal for the voltage set point, which is thus tied to the actual desired level of oxygen partial pressure. This OGC or mass spectrometer value is updated more slowly than the voltage. This dual feedback loop provides a fast response that optimizes the process control and maintains a unique relationship between the control set points and the selected partial pressure of oxygen.

In order for the process to function in the preferred manner, one desires to also establish an anode surface in close proximity to the plasma but shielded from deposition, since the insulating film produced in the process will cause the anode to become non-functional if not protected and would cause the process to stop.

Deposition protocol

The appropriate partial pressure of oxygen has been previously selected from an initial determination of the hysteresis curve, which relates the gas flow (see FIG. 5) and the target voltage (see FIG. 4) to the set partial pressure of oxygen in a fixed and determinable way for a given system and given operating conditions. The partial pressure that is selected will be that which uses the least amount of reactive gas and still makes a coating with the desired properties. Once the partial pressure of $O_2$ has been determined that corresponds to the desired properties of the oxide coating (e.g., optically clear), and the target voltage for that partial pressure is known, the necessary set points for the process can be inserted into the controllers.

The following operating parameters are set:

The power supply (with Sparc-Le unit) is set for a constant power of 2 kW.

The target voltage set point is set to achieve a level of −340 volts.

The MKS controller/Baratron is set to adjust the argon flow to maintain a constant total pressure of 8 mTorr.

The partial pressure set-point is set for 0.03 mTorr on the OGC (actual numbers may vary depending on the calibration of the pressure gauges used, but the relative location on the hysteresis curve will not vary for a coating of a given composition, deposited at a given rate).

It is preferred, for example, to bias the substrate by adjusting the rf power supply to 1 kW.

The coating thus produced is clear and insulating and the rate of deposition is about 1600 Å/min, compared to the pure metal deposition rate of about 2000 Å/min.

Following is a table which summarizes experimental results associated with various film compounds applied by the process using the apparatus of the invention:

aluminum target was mounted on the cathode (US' Gun II). The cathode was powered by an ENI RPG 60 dc power supply. The substrate holder was located approximately 7 cm below the cathode. An inductively coupled rf plasma was generated in the region between the sputtering source and the substrate plane. The plasma was generated by applying a 13.56 MHZ rf power to a two turn, 0.635 cm (0.25 inch) in diameter, water-cooled, Cu tube in the vacuum chamber. The diameter of the Cu coil was 15 cm and was located 5 cm below the carbon target. The matching network was modified from a conventional "L" network by removing the inductor. The rf power is applied to two air-gap 30–1000 pF adjustable capacitors. One goes to ground, and the other is in series with the rf coil. A third air-gap 30–1000 pF adjustable capacitor is in series between the rf coil and ground. With this configuration, the beginning and the end point of the rf coil can be 180 degrees out of phase with each other by adjusting the capacitors. The center of the rf coil had low voltage and sputtering of the Cu coil was therefore reduced. The rf coil was also covered by woven fiber glass blanket in order to avoid any sputtering of the Cu coil. The chamber was pumped down by a 270 liter/sec. turbo pump to a base pressure of $2 \times 10^{-6}$ Torr.

TABLE OF METAL-OXIDE DEPOSITION EXPERIENCE

| Metal | Compound (could choose non-stoichiometric) | Target Power, kW | Target Voltage, V | Reactive Gas partial pressure, mTorr | Substrate bias voltage, V | Pure metal deposition rate, Å/min | Oxide deposition rate, Å/min |
|---|---|---|---|---|---|---|---|
| Al | $Al_2O_3$ | 2 | −340 | 0.03 | floating | 2000 | 1600 |
| Ti | $TiO_2$ | 5 | −480 | 0.1 | −100 | 2500 | |
| Zr | $ZrO_2$ | 5 | −358 | 0.06 | −150 | 3400 | |
| Hf | $HfO_2$ | 5 | −507 | 0.28 | −100 | 3000 | |
| Cr | $Cr_2O_3$ | 5 | −530 | 0.22 | −100 | 4000 | |

Figure 6:
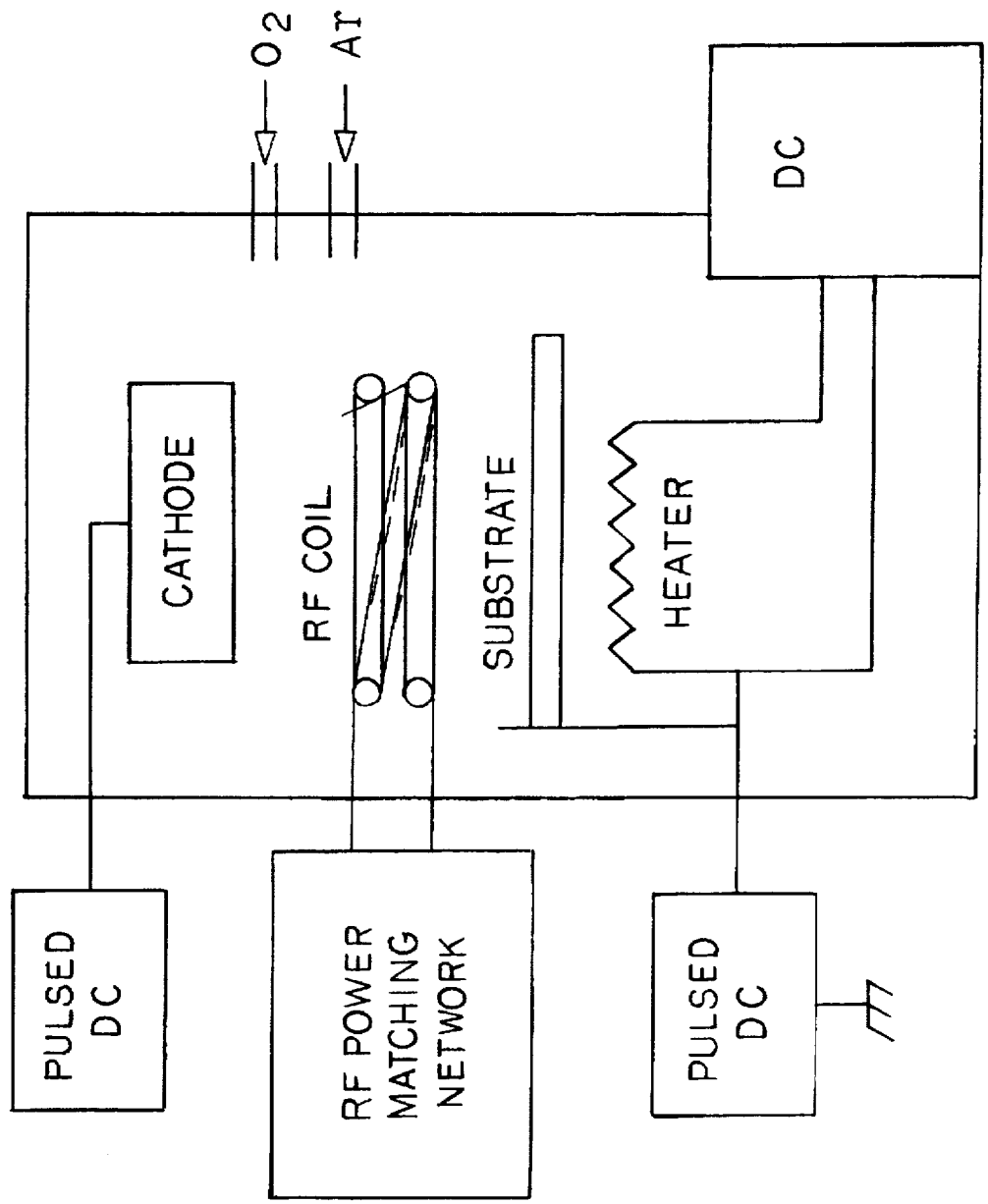
FIG. 6 is a schematic view of a vacuum chamber for an alternative or variant magnetron sputtering system wherein an ionization energy source is included intermediate the cathode and substrate.
Figure 7:
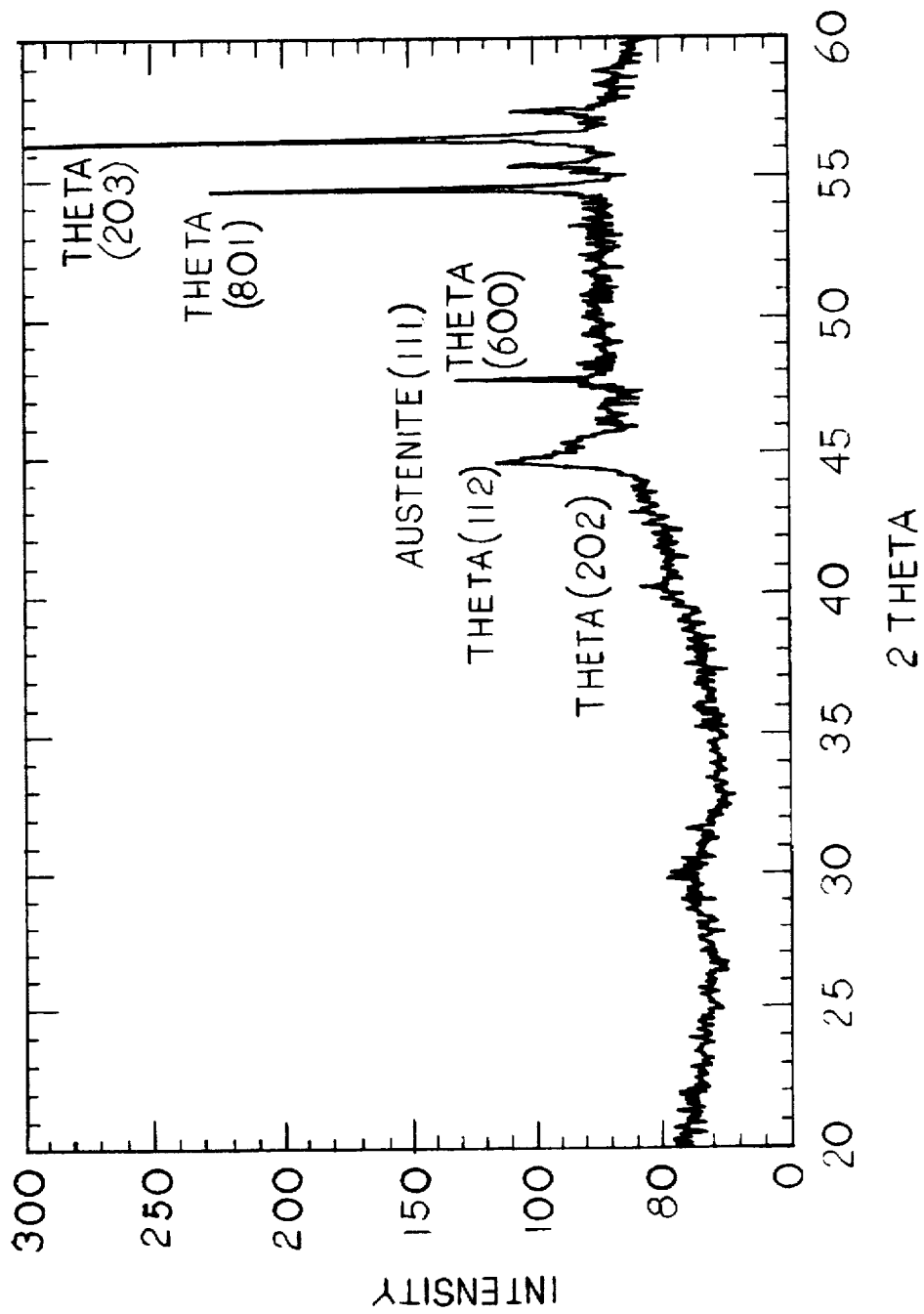
FIG. 7 is a diffractogram of a coating of crystalline alumina deposited at 180° C.

As a further argumentation or variant of for the coating process, an energy source (such as those referenced above) may be interposed between the cathode and substrate for the purpose of enhancing the ionization energy of the reactive species, particularly the positive or metal ion species. One such energy source is a radio frequency voltage source as described, though again, other sources, as referenced above, may be utilized. FIG. 6 illustrates utilization of a radio frequency coil 15 so incorporated in a system generally of the type depicted in FIG. 1 and as used in various experiments described below to enhance ionization of the positive ion species. Thus like numbers are used on like parts. The degree of enhancement of the ionization energy may be quantified by measurement of the current density (mA/cm²) at the substrate 14. Also, the system of FIG. 6 includes a heater 17 for the substrate 14.

With the arrangement of FIG. 6, it is possible to effect substrate coatings in crystalline form wherein the substrate temperature is maintained at less than about 550° C. during the coatings process. In practicing such a process, therefore, various substrate materials may be used including silicon, tool steel, etc. Also, in practicing such a process, various target materials (typically metals or similar compound forming materials which are ionized during the process as positive ions) are useful. The reactive gas may be varied to include these materials, which when ionized, provide reactive ions such as, but not limited to, oxygen Following are examples of the practice of the invention utilizing the arrangement represented by FIG. 6:

Deposition of Crystalline Layers of Alumina on a Substrate

A research scale ionized magnetron sputtering system was built as in FIG. 6. A high purity (99.9% pure) 5 cm (2 inch)

Aluminum (purity 99.9%) was sputtered at a total pressure of 28 m Torr in an argon/oxygen atmosphere. The power density at the magnetron was kept constant at 10 watts/cm². The ratio of oxygen to argon was maintained to enhance the formation of stoichiometric alumina. Oxygen flow was maintained at 2 sccm resulting in oxygen partial pressure of $4 \times 10^{-4}$ Torr, which was maintained during the coating process. The substrate 14 was heated by heater 17 to various temperatures below 550° C.

Experimental Results

Utilizing the apparatus as schematically depicted in FIG. 6 and the experimental conditions outlined above, an alumina coating was applied by the sputtering technique described onto a substrate of 316 stainless steel coated silicon wafers. The substrate ion density was varied from 4.9 to 25.6 milliamps per square centimeter by either altering the degree of ionization of the discharge with the radio frequency coil power and/or altering the substrate bias potential. The ion energy was also varied with the substrate bias potential. In the experiments conducted, the frequency of the dc pulse power source was 150 Khz. The average voltage was −453 volts and the peak to peak variance was 1.5 kilo volts.

Figure 16:
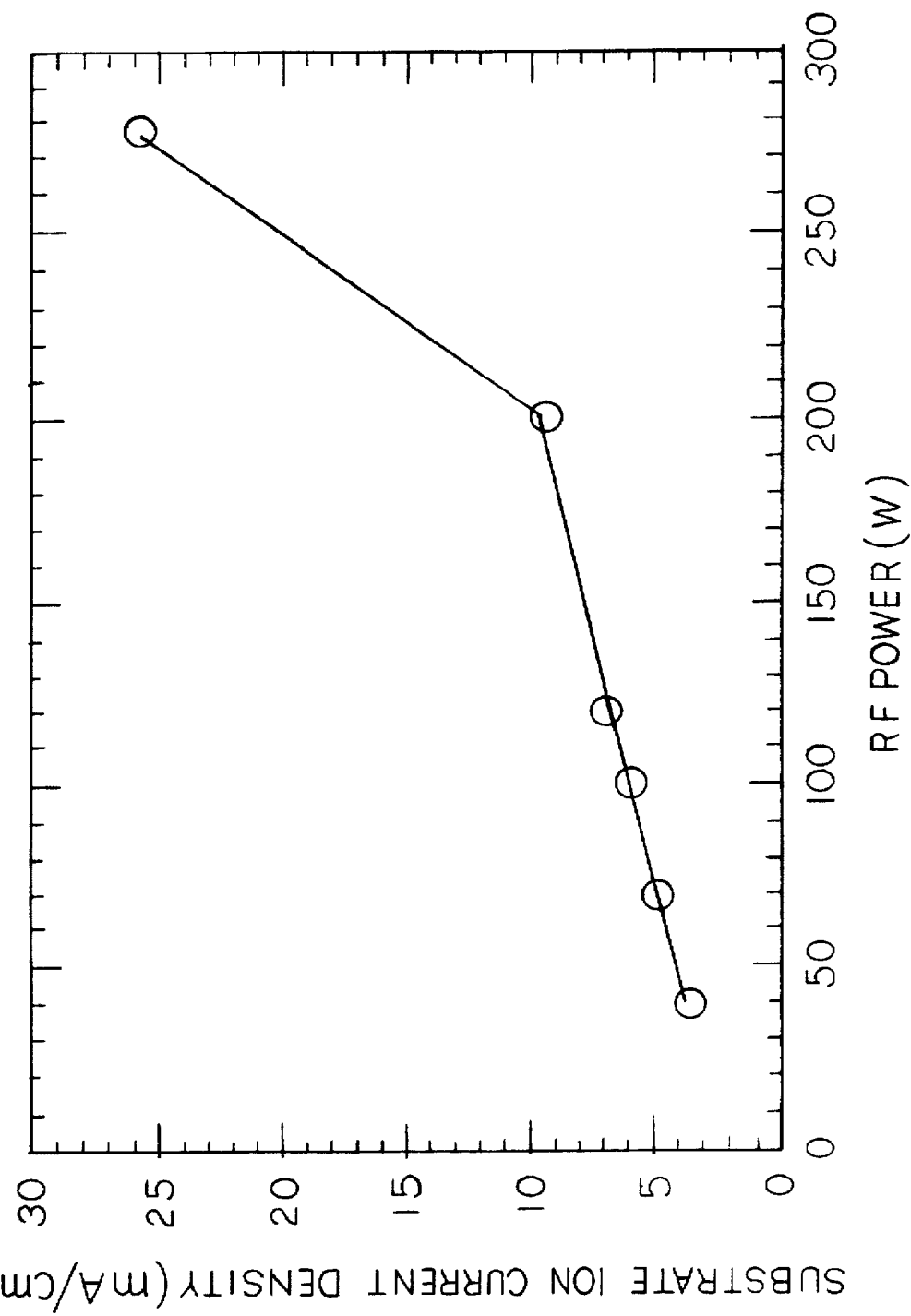
FIG. 16 is a graph of ionization energy (rf power) versus substrate current density.

Referring to FIG. 16, it was discovered that at a constant substrate bias potential of −70 volts, increasing the radio frequency coil power from 40 to 280 watts resulted in an increase in substrate ion current density and thus an increase in reactivity. This indicates that there is a direct correlation between the ion current density and the increase in radio frequency power.

Figure 15:
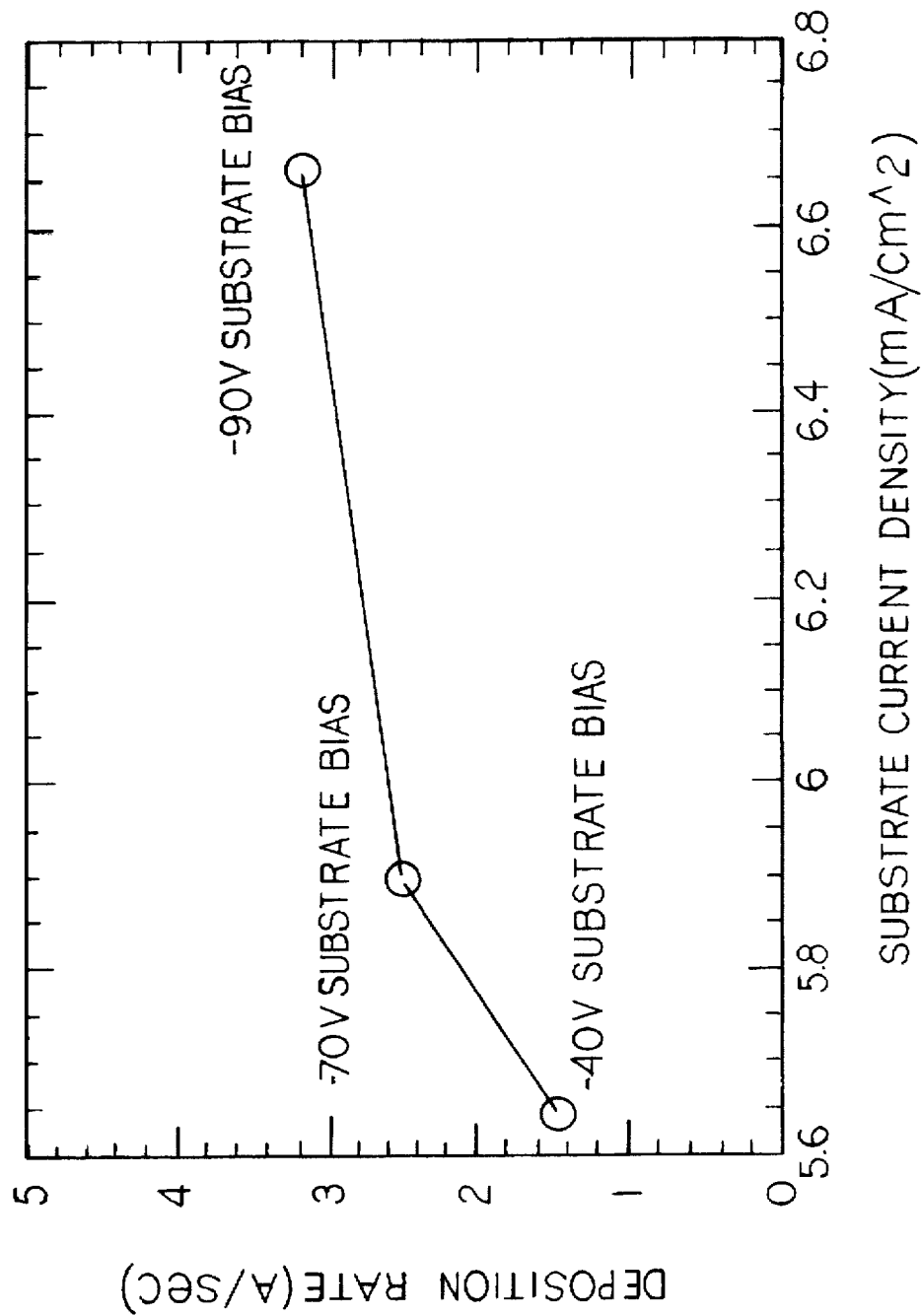
FIG. 15 is a graph of substrate current density versus coating deposition rate.

FIG. 15 illustrates the impact of increasing substrate current density, i.e., substrate ion current density. Thus, as the substrate current density increases, the deposition rate of the coating also increases as represented by FIG. 15. This is demonstrated by maintaining the radio frequency coil power at 100 watts. The increased substrate bias potential was then varied as indicated, indicating that the deposition rate increase with increased collection of the ionized aluminum.

Perhaps more importantly, the experimental results indicate that crystalline alumina is formed on the substrate surface at the lower temperatures, below 500° C.–550° C. For example, referring to FIG. 7, there is depicted the theta form of alumina deposited at a –40 volt substrate bias potential and 180° temperature of the substrate. The theta form is not considered to be the most desirable for purposes of coating hardness. Nonetheless, it is noted that a crystalline structure is formed under the conditions defined.

Figure 8:
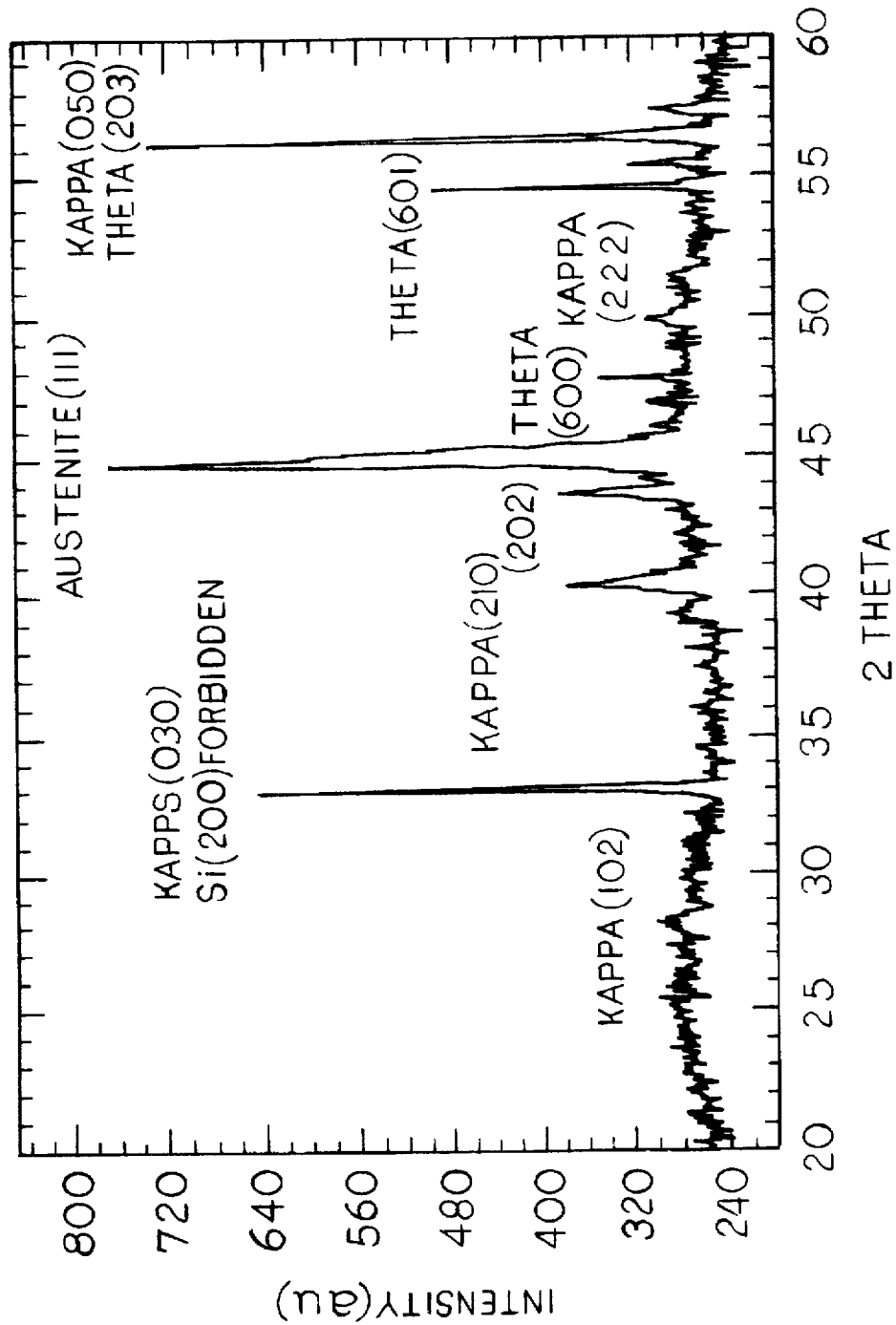
FIG. 8 is a diffractogram of a coating of crystalline alumina deposited at 320° C.
Figure 9:
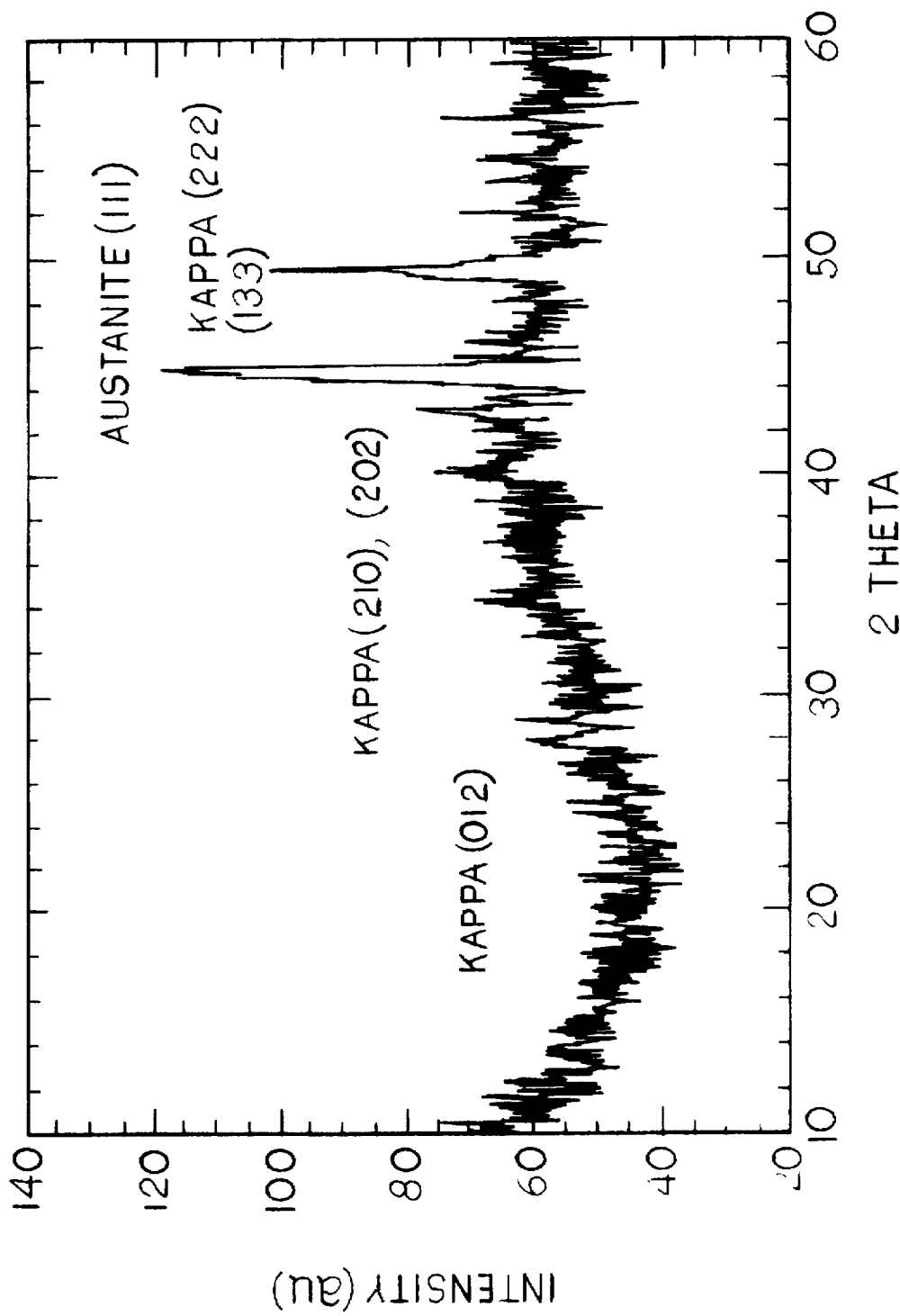
FIG. 9 is a diffractogram of a coating of alumina deposited at 370° C.–430° C. at a substrate current density of 3.6 mA/cm$^2$.

FIG. 8 depicts the formation of desirable kappa orthorombic alumina where the substrate bias is –70 volts and the temperature is 320° C. FIG. 9 is a diffractogram indicating the deposition of kappa phase aluminum in a test run where the substrate bias potential was kept constant at –70 volts and the temperature was in the range of 370° C.–430° C. and the current density of the substrate was 3.6 milliamps per square centimeter. Typically, the prior art suggests that the lowest temperature for the formation of kappa aluminum is around 1000° C.

Figure 10:
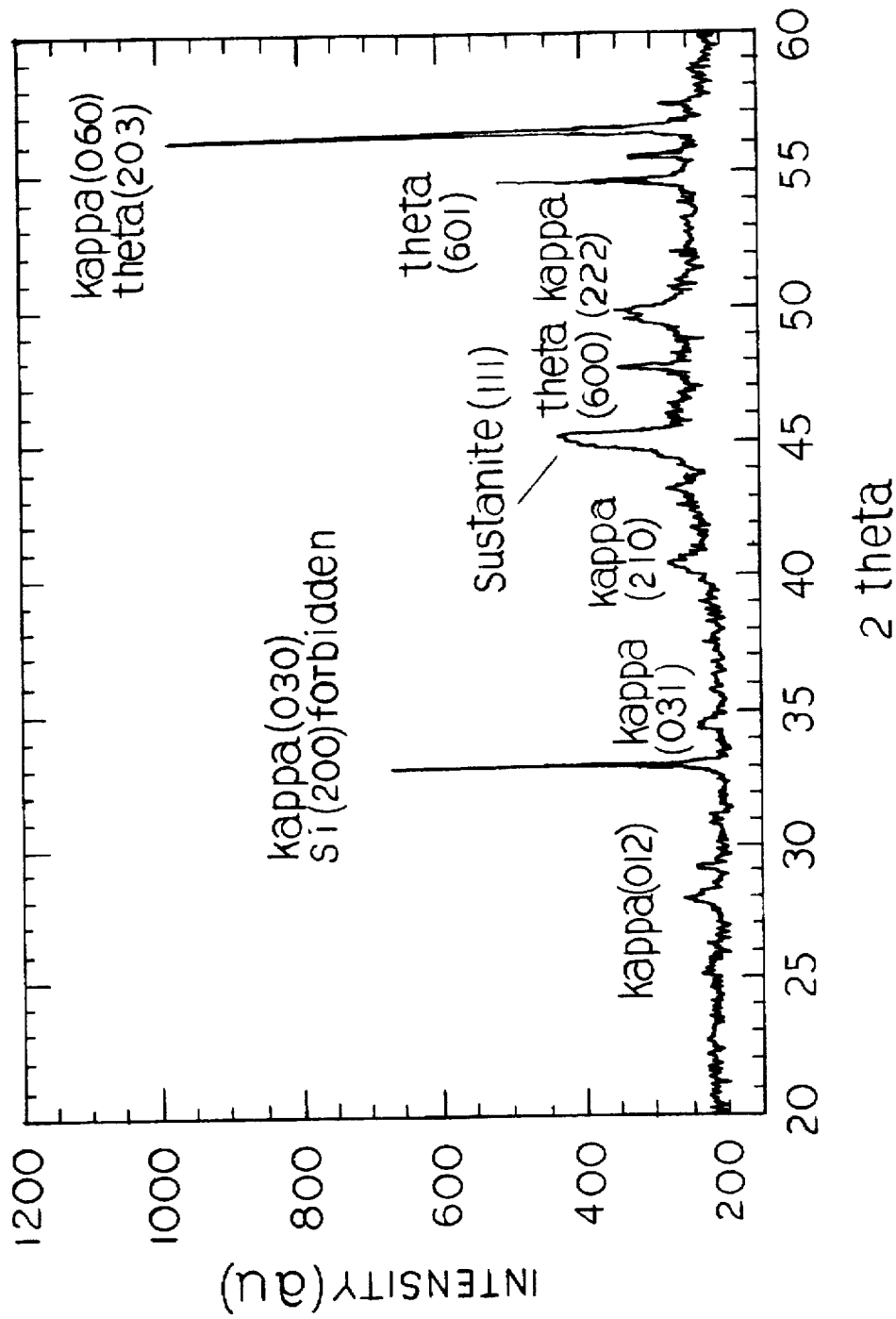
FIG. 10 is a diffractogram of a coating of alumina deposited at 370° C.–430° C. at a substrate current density of 4.9 mA/cm$^2$.
Figure 11:
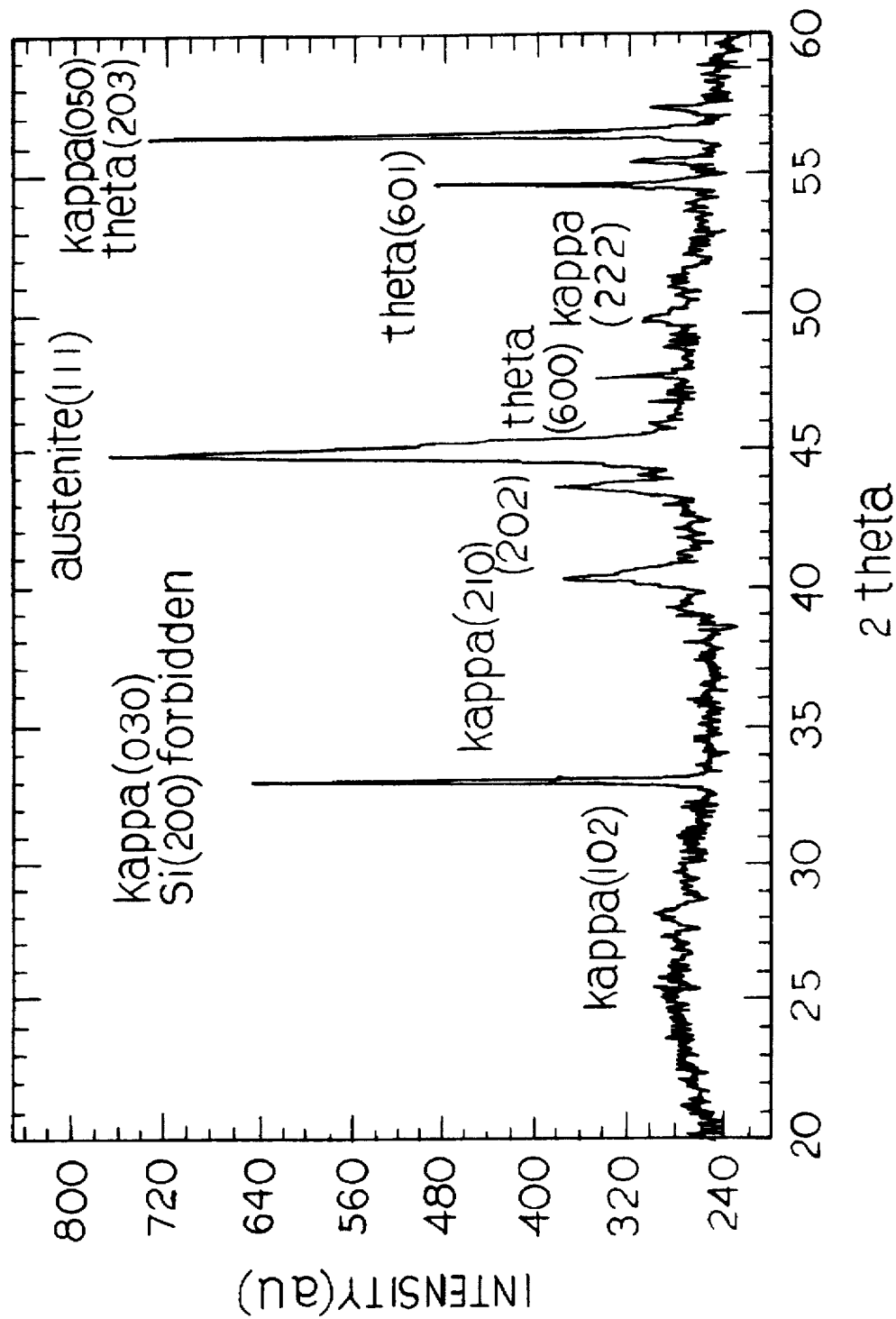
FIG. 11 is a diffractogram of a coating of alumina deposited at 370° C.–430° C. at a substrate current density of 5.9 mA/cm$^2$.
Figure 12:
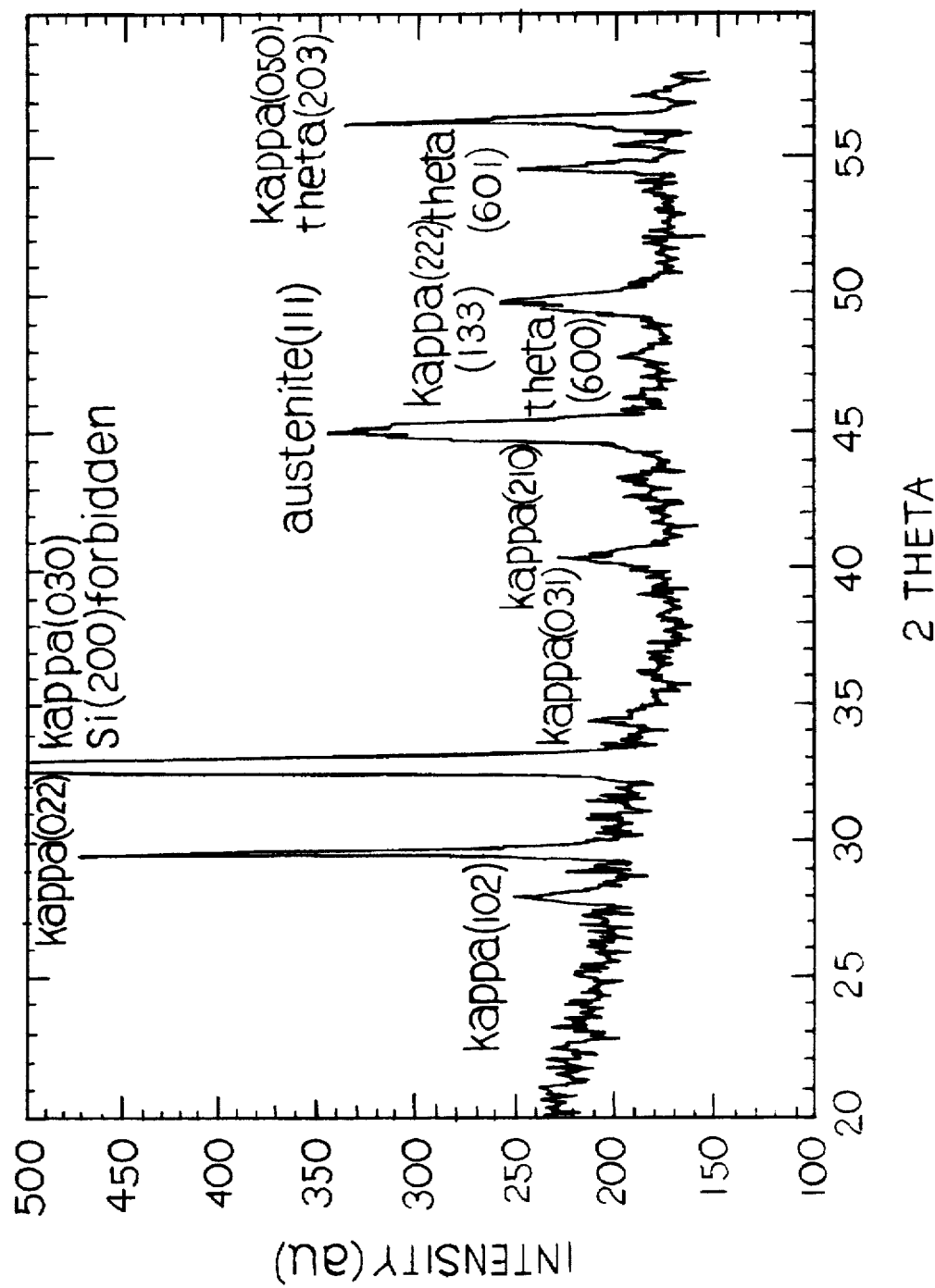
FIG. 12 is a diffractogram of a coating of alumina deposited at 370° C.–430° C. at a substrate current density of 25.6 mA/cm$^2$.

FIG. 10 is very similar to FIG. 9 in terms of the experimental conditions; namely, the bias voltage was –70 volts and the temperature of the substrate was maintained in the range of 370° C.–430° C. The current density of the substrate was maintained to 4.9 milliamps per square centimeter. FIG. 11 illustrates the results the experiment under the same conditions as FIG. 10, except that the substrate is maintained at a current density of 5.9 milliamps per square centimeter. FIG. 12 is yet another experiment conducted under the same conditions, except that the substrate 14 is maintained at a current density of 25.6 milliamps per square centimeter. In all instances the kappa (orthorombic) metastable form of alumina as a hard, protective coating is formed at temperatures below 500° C.–550° C. and in the range of 370° C.–430° C. As evident from FIGS. 10 through 12, as the ion current density on the substrate increases, there is an increase in the kappa phase crystallinity of the coating. The most well-defined pattern of crystallinity is thus shown in FIG. 12 wherein the ion current density on the substrate is 25.6 milliamps per square centimeter. It is also to be noted that the substrate coating, in all instances, resulted in the formation of crystalline alumina, either kappa and/or theta phase being detected in the experiments conducted.

Figure 13:
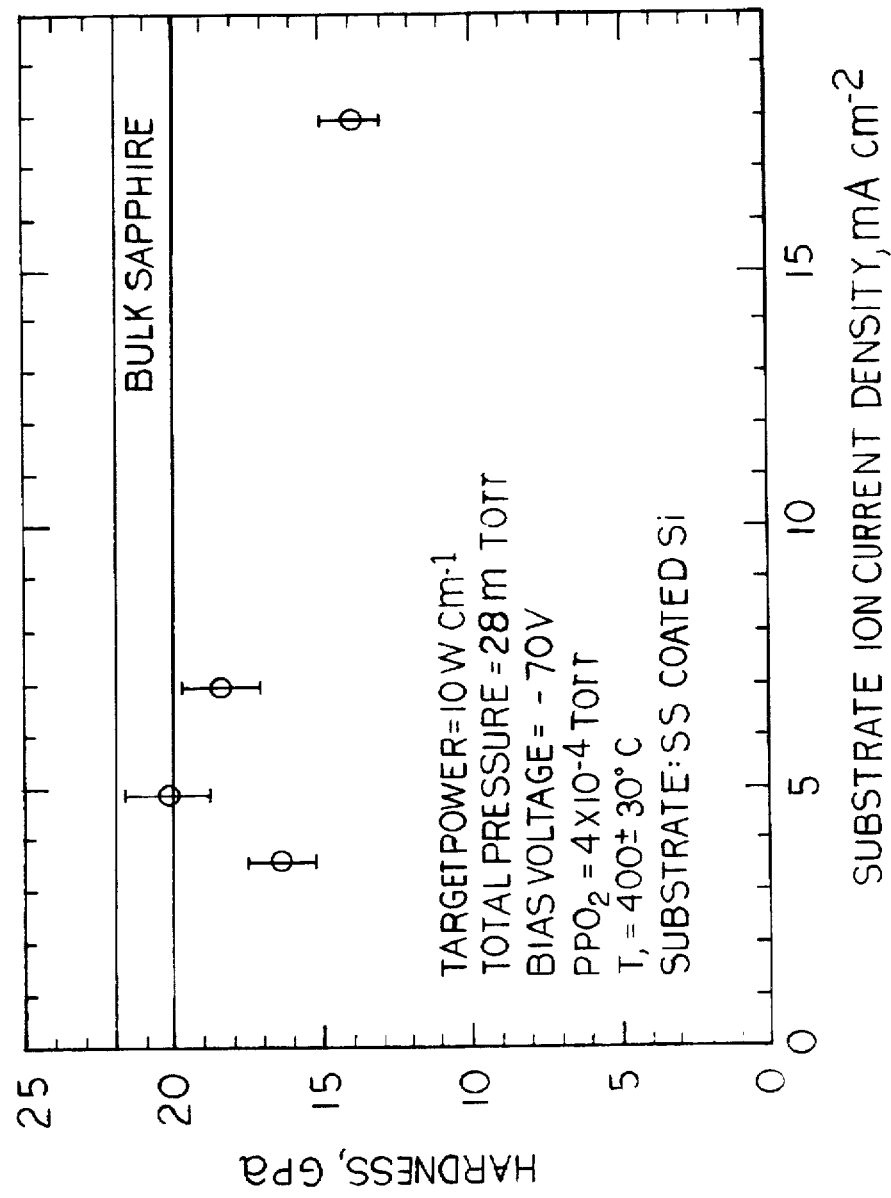
FIG. 13 is a graph of alumina hardness versus substrate current density.
Figure 17:
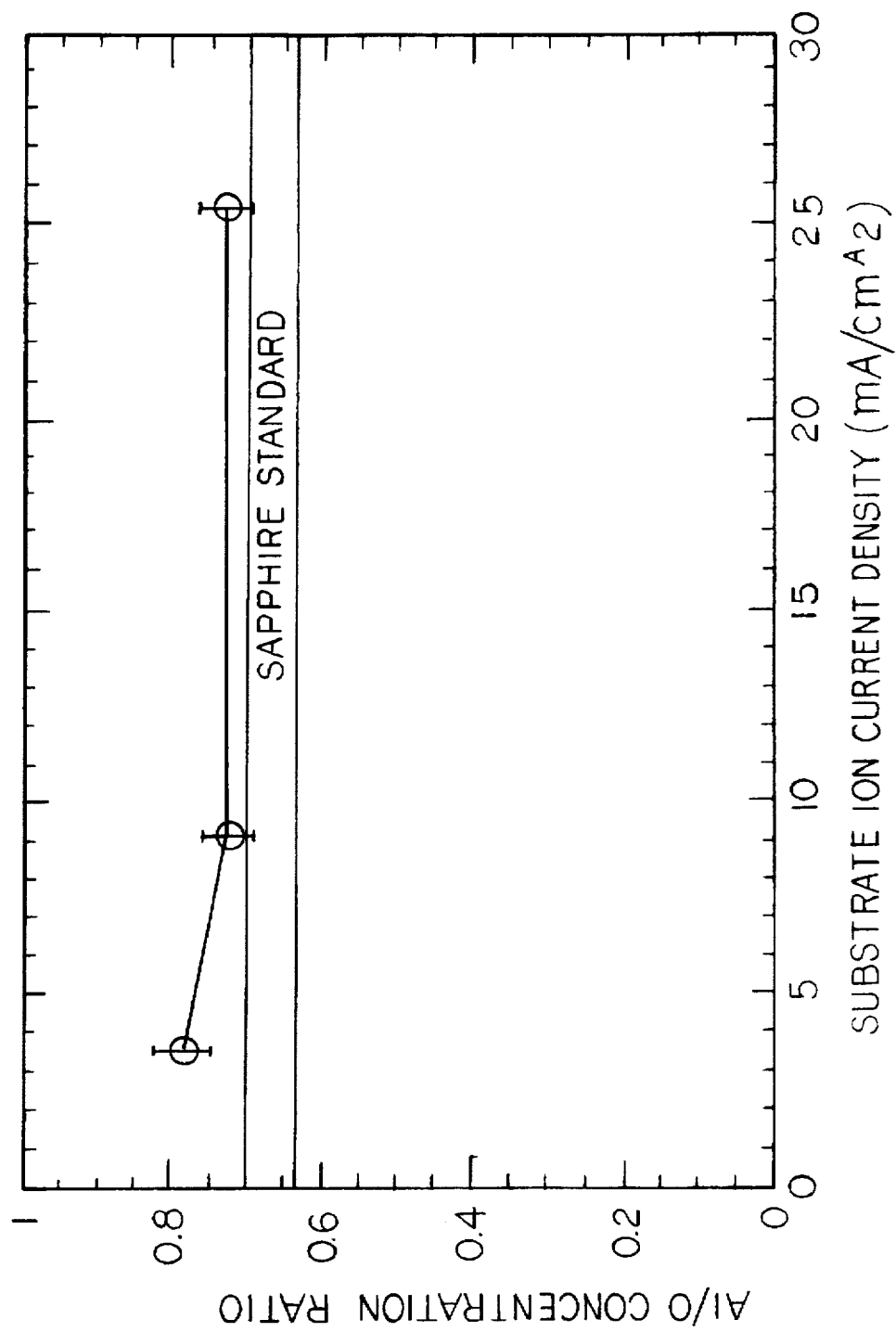
FIG. 17 is a graph of substrate current density versus Al/O ratio.

FIG. 13 illustrates the effected current density of the substrate on hardness which is generally equivalent to that of bulk sapphire (crystalline alumina). Thus, it is demonstrated that a hard and protective coating is applied to the substrate using the techniques described over a range of current densities on the substrate with the preferred current density being 4.9 milliamps per square centimeter. FIG. 17 depicts the relationship between the current density and the ratio of aluminum to oxygen and demonstrates that the chemical composition of the alumina within the error of measurement is stoichiometric regardless of the current density involved.

Figure 14:
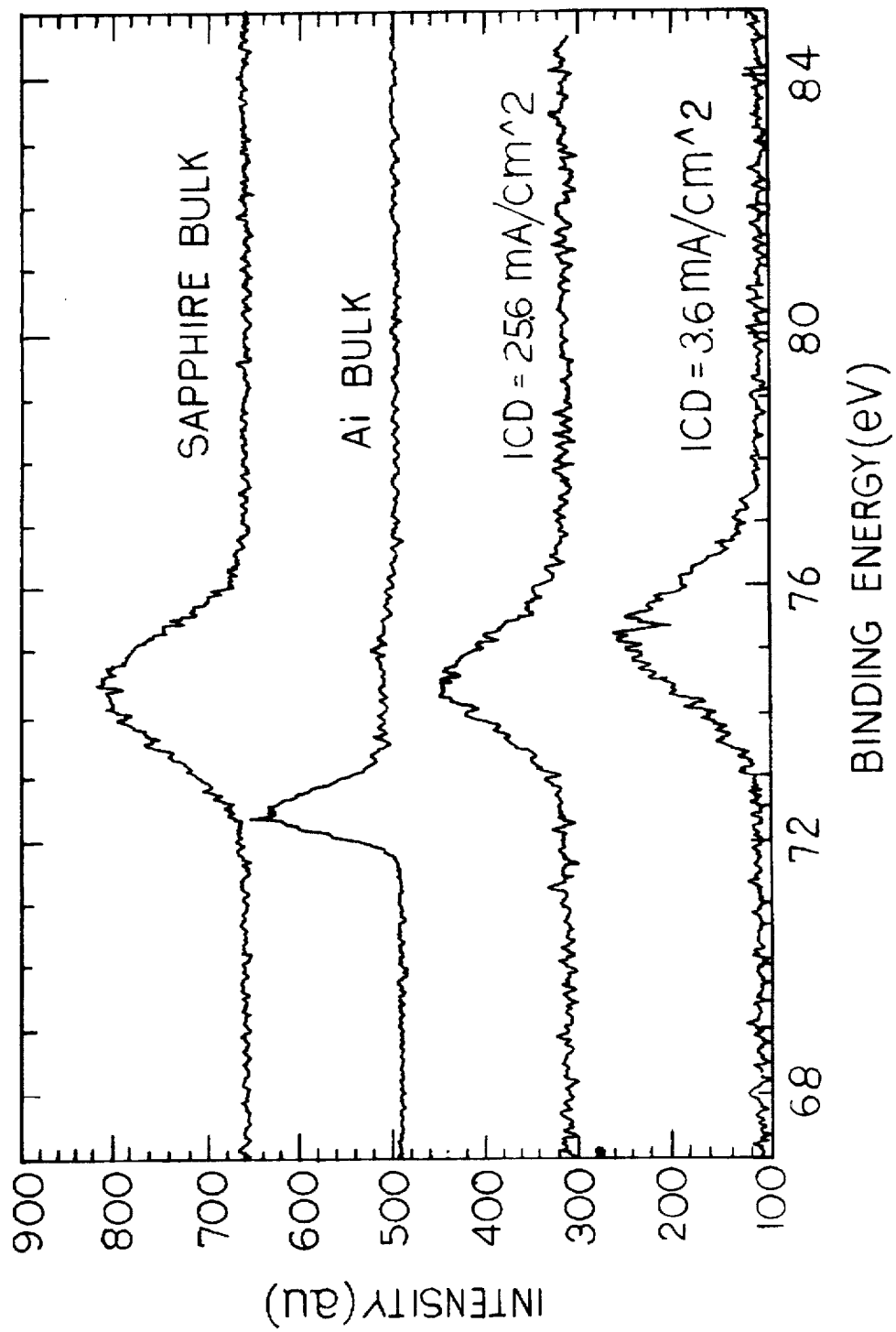
FIG. 14 is a comparative graph of the binding energy of coatings and standard materials.

FIG. 14 depicts the binding energy associated with films produced using the various experimental conditions as contrasted to bulk sapphire and aluminum. The data suggests that there is no free metal in the film or coating that has been applied to the substrate and that the compound is stoichiometric.

The coating described may be applied in layers and further when the application of various layers is effected, the conditions of application may be varied in order to vary the makeup of the coating. The coating materials may also be varied so as to have composite layered materials applied as a coating. With the process of the invention, it is thus possible to provide alumina coatings and other coatings having a hardness substantially equivalent to the hardness of the stable crystalline form of the compound and to apply such a coating at lower temperatures, i.e., less than about 500° C.–550° C. This is accomplished by enhancing the ionization of the atomic species so that it migrates to the substrate being coated which is maintained at a negative potential to provide a stoichiometric, crystalline coating with improved hardness and coating characteristics including, for example, protective characteristics. This is augmented by using a pulsed dc power magnetron sputtering apparatus wherein the pulsed power is provided both to the cathode and the substrate and is further augmented by the introduction of energy into the system to enhance the ionization and thus the current density on the substrate.

Operational parameters may be varied such as the substrate energy input (bias voltage), ionization energy source and power, substrate temperature range, the target power, the ambient as well as reactive gas pressure and nominal target voltage. Operation temperature ranges of a heated substrate 180° C. to 550° C., substrate current densities of about 1 to 30 milliamps/cm$^2$, negative biasing of the system up to –90 or more volts and other parameters described and material described may be used. Such changes may be incorporated in the process and apparatus of the invention without departing from the spirit and scope of the invention.

Multilayer Oxide Coatings

Figure 18:
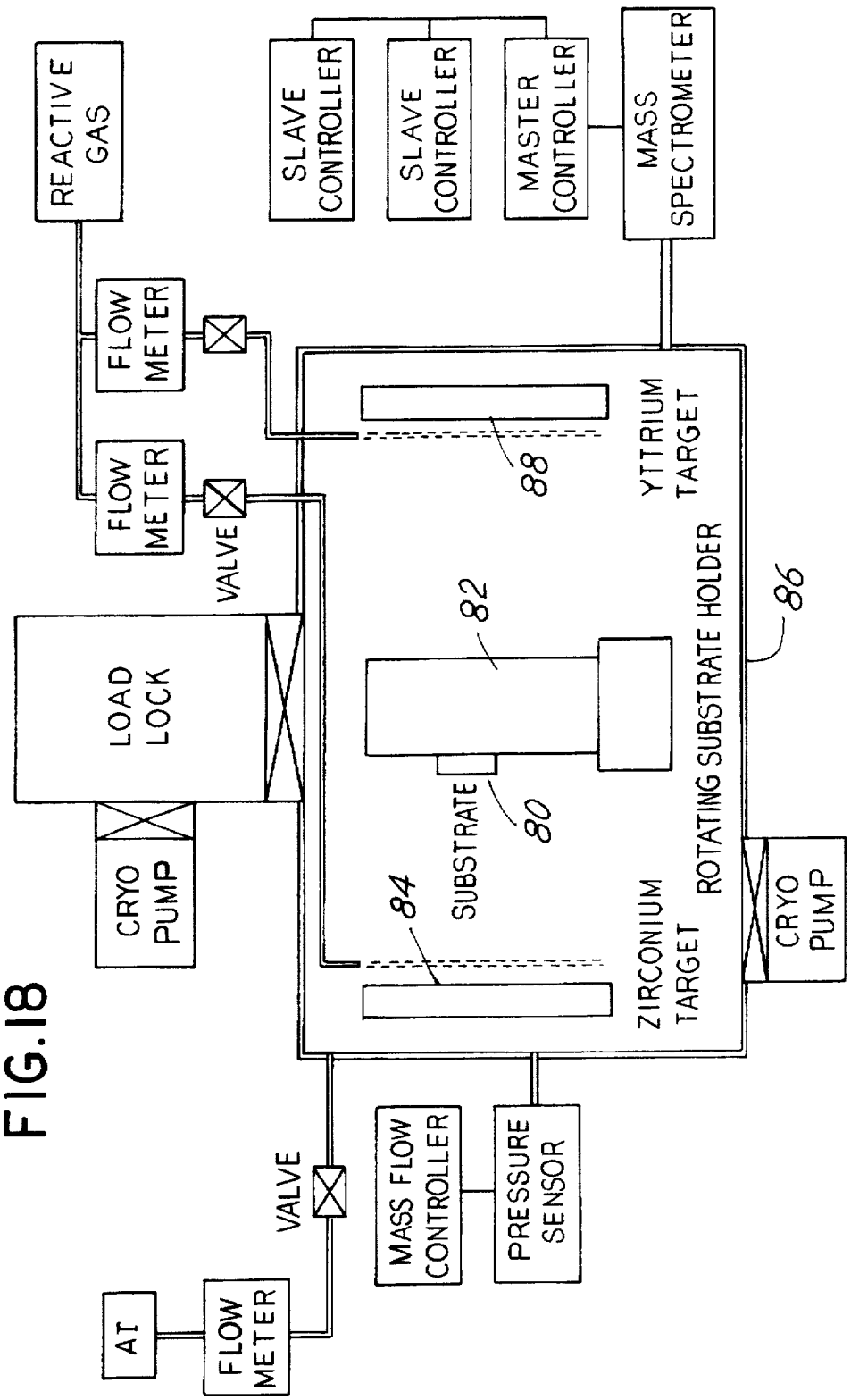
FIG. 18 is a schematic drawing of the deposition system used to simultaneously deposit a multilayered coating or a substrate.
Figure 19:
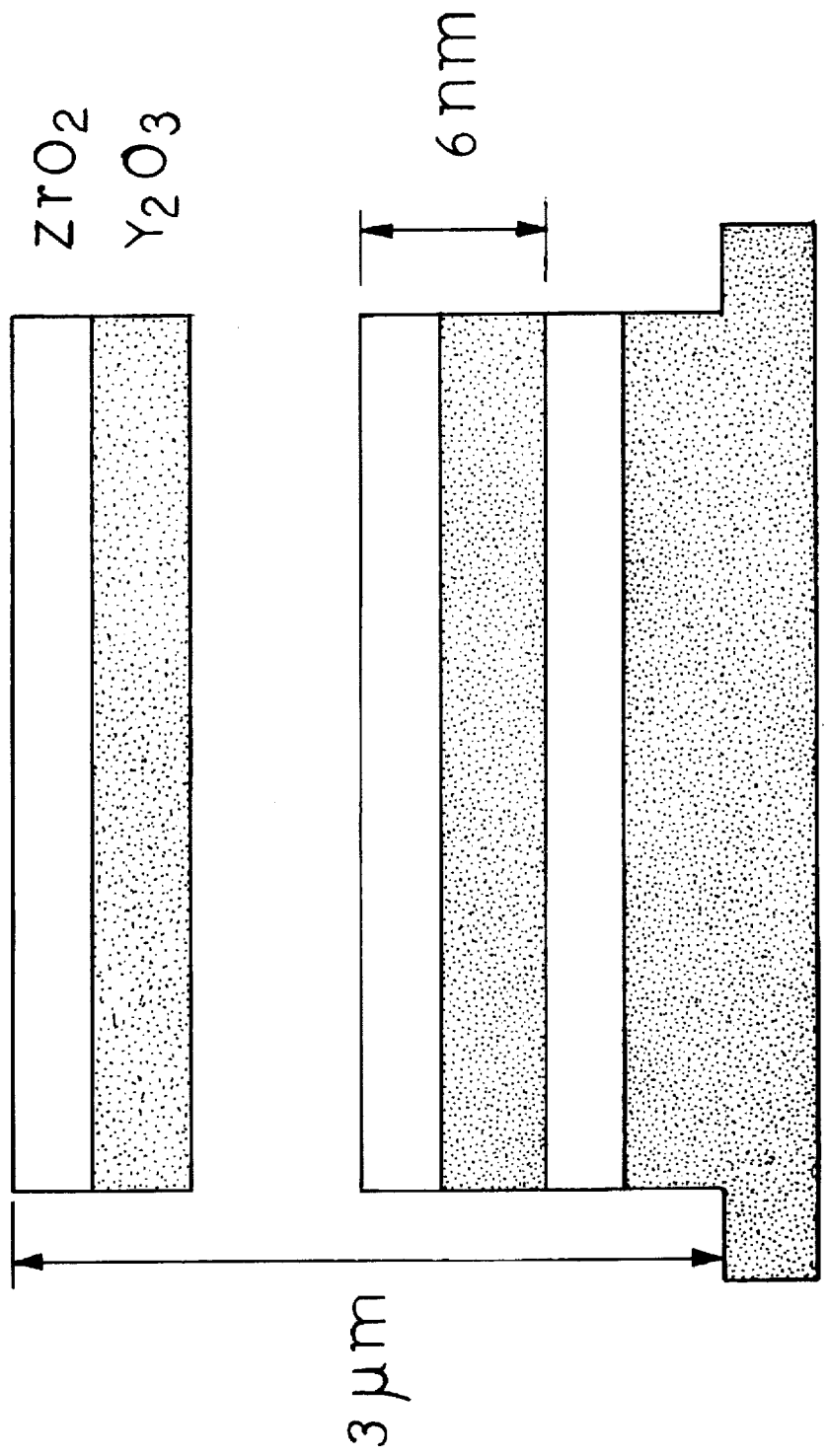
FIG. 19 is a schematic drawing of a nanometer multilayer, metal oxide coating comprised of yttrium oxide and zirconium oxide.
Figure 26:
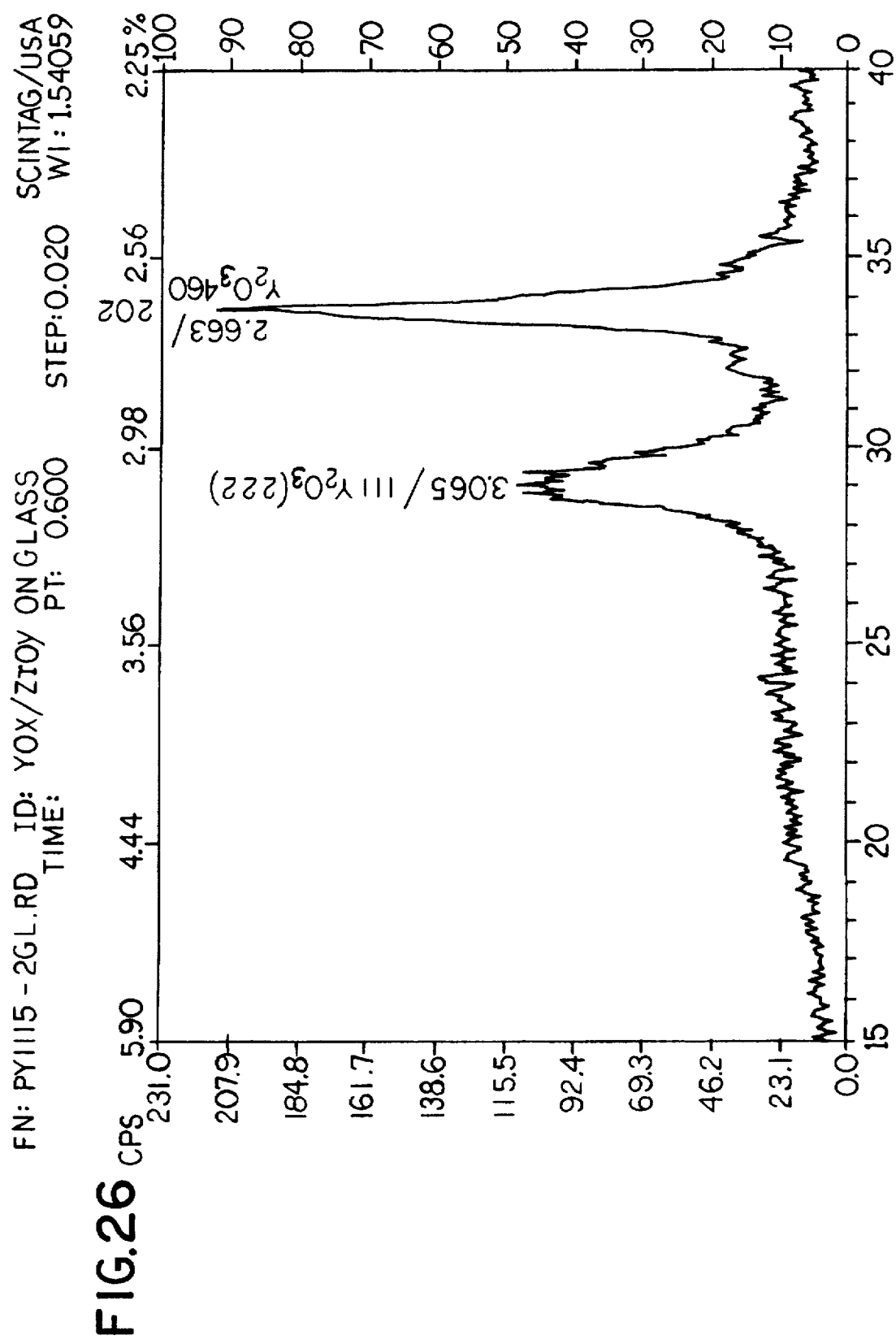
FIG. 26 is an X-ray diffraction plot like that of FIG. 22 except that the rate of substrate rotation is five (5) revolutions per minute.
Figure 27:
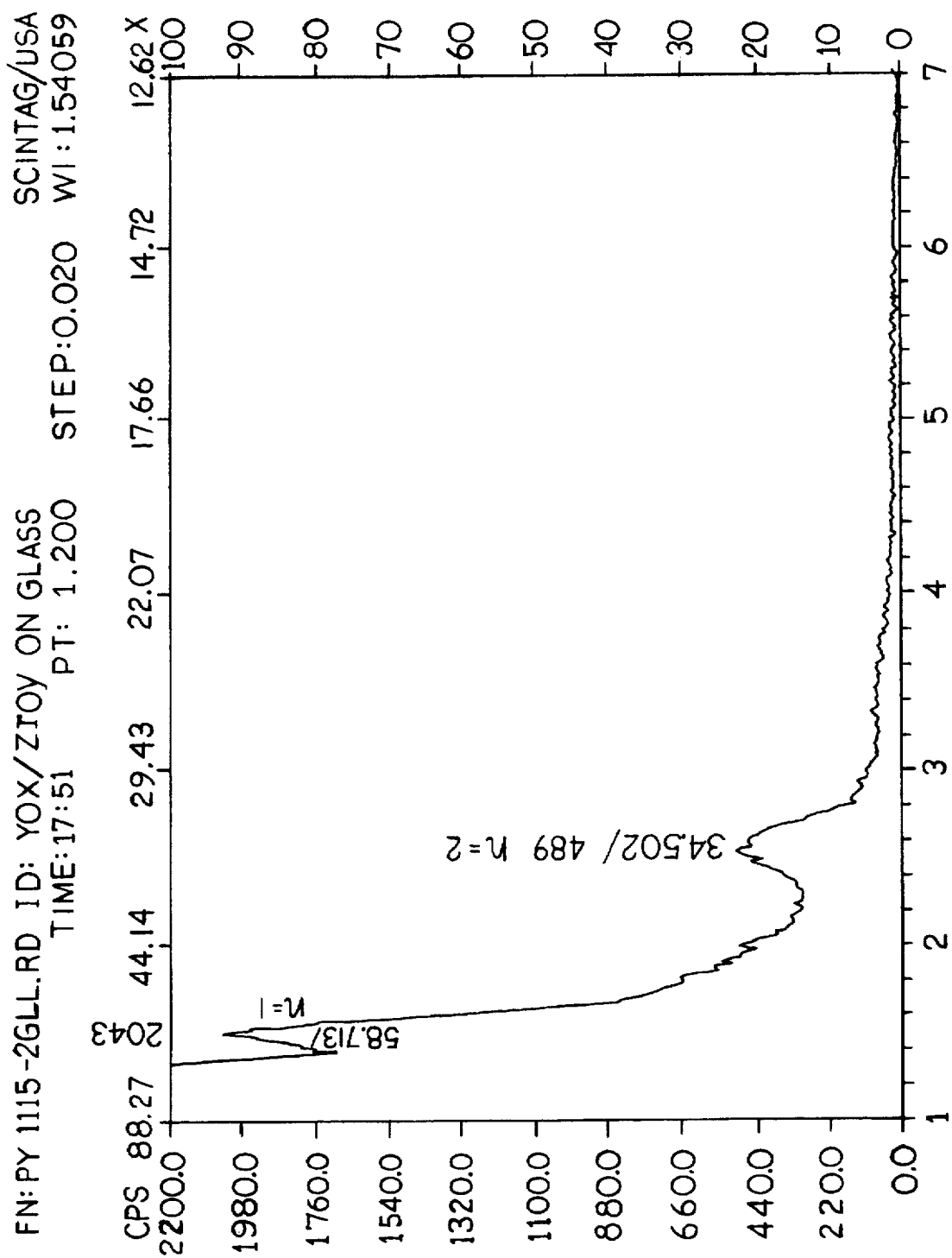
FIG. 27 is an X-ray diffraction plot like that of FIG. 23 except that the rate of substrate rotation is five (5) revolutions per minute.
Figure 28:
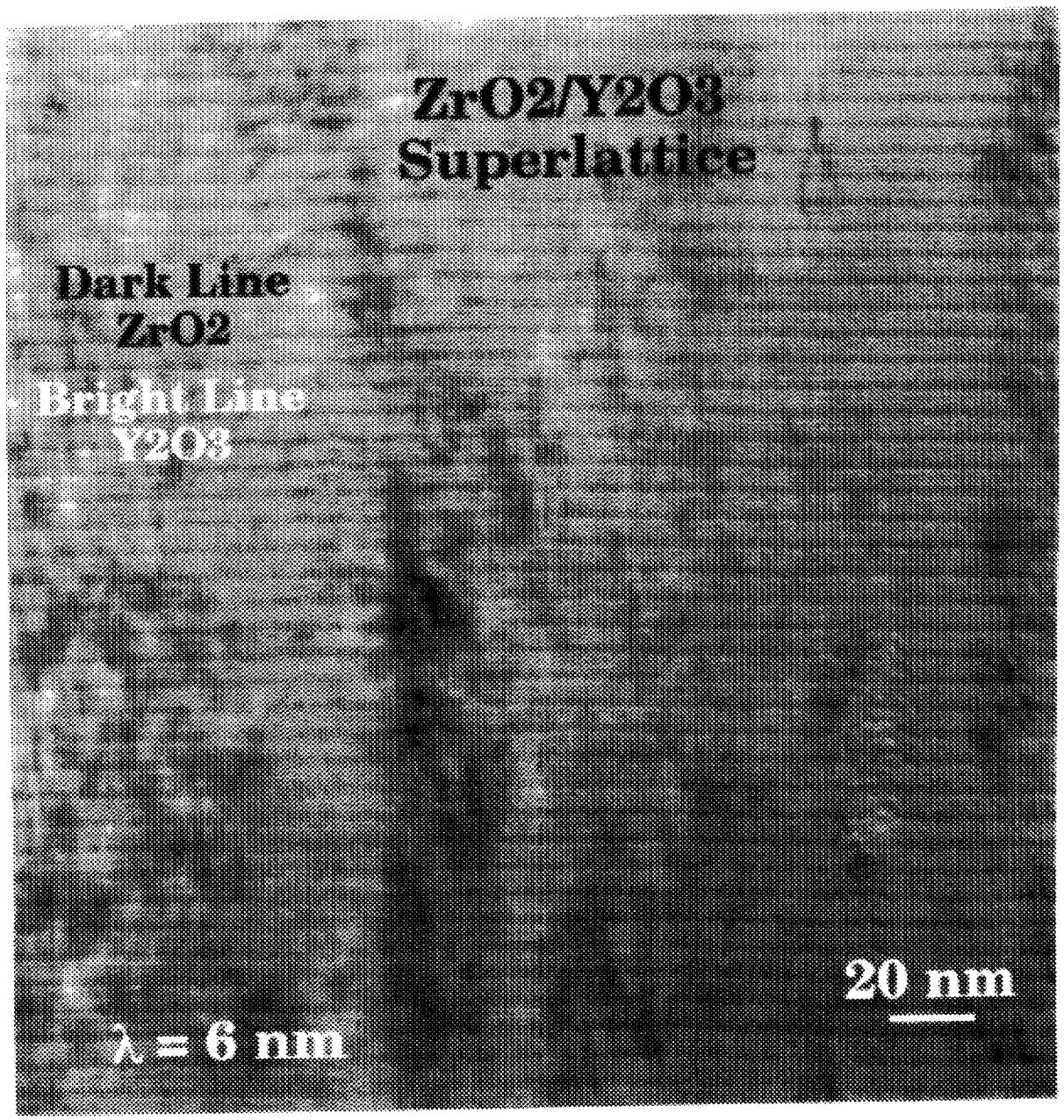
FIG. 28 is a cross section transmission electron microscopy micrograph depicting the layered structure of the zirconium oxide and yttrium oxide coating.
Figure 29:
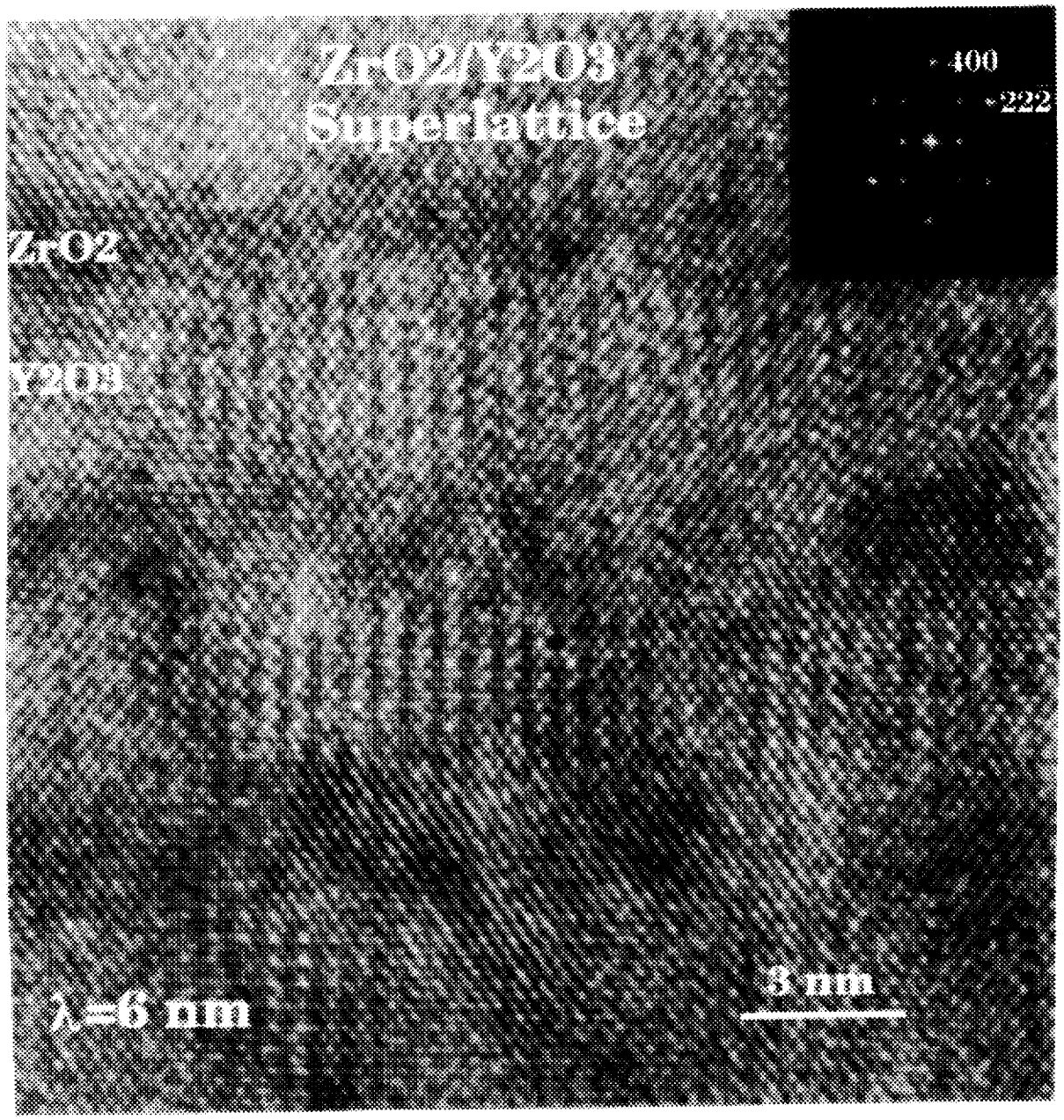
FIG. 29 is a cross section transmission electron microscopy micrograph of a different scale illustrating the layered structure of the coating of zirconium oxide and yttrium oxide.

FIGS. 18 through 29 relate to the preparation of a multilayer metal oxide film coating upon a substrate utilizing the high rate reactive sputtering process described above and resulting in a coating having improved hardness characteristics relative to the hardness of a unitary stoichiometric oxide layer or film of material which comprises the multilayer oxide coating. Thus, referring to FIG. 18, there is depicted a schematic drawing of the specific deposition system used to deposit multilayer, metal oxide coatings of the type described below. FIG. 19 is a schematic drawing of a coating created utilizing the system of FIG. 18. FIGS. 20 through 27 are x-ray diffraction data confirming the crystalline structure of the coating materials and the layered structure of the coated materials. FIGS. 28 and 29 are cross section transmission electron microscopy micrographs which depict the layered structure of the coatings as well as the crystalline structure. All of these features are discussed in greater detail below with respect to a multilayer, metal oxide coating comprised of a film of yttrium oxide layered with zirconium oxide. Also set forth is a table of the conditions associated with the creation of the described coatings using the arrangement of FIG. 18.

Thus, referring to FIG. 18, there is schematically depicted schematically the deposition system utilized for coating yttrium oxide and zirconium oxide simultaneously. The substrate material or substrate 80 which is to be coated is mounted on a rotation substrate holder 82 which rotates about its vertical axis. A zirconium target 84 is provided along one side of chamber 86. A yttrium target 88 is provided on the opposite side of chamber 86. The system is otherwise as generally disclosed heretofore with respect to FIGS. 1 through 17.

In operation, substrate materials, such as glass or silicon, are mounted on the substrate holder 82 which is rotated between the two cathodes or targets 84 and 88. As the substrate 80 passes in front of the zirconium target 84, a thin nanometer scale layer of zirconium oxide is deposited thereon. When passed in front of the yttrium target 88, the substrate 80 is coated with a thin nanometer scale layer of yttrium oxide on top of the zirconium oxide layer. The thickness of each layer deposited utilizing this technique is preferrably in the range of one to five nanometers and is dependent upon the speed of the rotation of the holder 82 and thus the speed of rotation of the substrate 80. The power to each sputtering target 84 and 88 as well as the partial pressure of the reactive gas, oxygen, are also factors affecting the thickness of the layers.

The substrate holder 82, and more particularly the substrate 80, is rotated until the total thickness of a multilayered deposit is in the micrometer range, that is, in the range of one to ten micrometers. This is depicted schematically in FIG. 19 wherein the general range of the thickness of the individual layers is one to five nanometers with a cumulative thickness of a pair of layers being in the range of about six nanometers, but typically in the range of two to ten nanometers. The layers are alternately built up until the total thickness of the multiple layers of alternating zirconium oxide and yttrium oxide is in the range of about three micrometers or more, for example, five or more micrometers.

As mentioned previously, partial pressure control of the reactive gas may be used to precisely control the deposition rate. The following table of conditions for coating sets forth the results of two runs utilizing the described technique for coating of films of alternating layers of yttrium oxide and zirconium oxide on glass and silicon substrates at different rates of substrate rotation.

TABLE OF CONDITIONS FOR COATING

|  | Run Number 1 | Run Number 2 |
| --- | --- | --- |
| Substrate: | Silicon | Silicon |
|  | Glass | Glass |
| Rotation Rate of Substrate Holder: | 10 revolutions/minute | 5 rpm |
| Base Pressure: | $1.3 \times 10^{-6}$ Torr. | $1.4 \times 10^{-6}$ Torr. |
| Pulse Drive Frequency | 60 k Hz | 60 k Hz |
| Reverse Pulse Time: | 6 per sec. | 6 per sec. |
| Reverse Pulse Voltage: | 20% | 20% |
| Coating Thickness: | 1.33 per m. |  |
| E TCH Conditions: |  |  |
| rf Power (kw) | 1.5 | 1.5 |
| dc Level | 225/260 | 238/250 |
| Time (min) | 5 | 5 |
| Argon Flow (sccm) | 110 | 106 |
| Argon Pressure (m Torr) | 4.0 | 4.0 |
| Sputtering Parameters: |  |  |
| Targets: |  |  |
| Left - | Zirconium | Zirconium |
| Right - | Yttrium | Yttrium |
| Power (kw): |  |  |
| Left - | 1.5 | 1.5 |
| Right - | 3.0 | 3.0 |
| Voltage: |  |  |
| Left - | 175/214 | 173/215 |
| Right - | 175 | 175 |
| Bias: |  |  |
| rf Power (kw) - | 2.25 | 2.25 |
| dc Level (v) - | 130/139 | 135/137 |
| Oxygen Supply: |  |  |
| Flow (sccm) - | 26/13.5 | 17/13 |
|  | 0 | 0 |

TABLE OF CONDITIONS FOR COATING -continued

|  | Run Number 1 | Run Number 2 |
| --- | --- | --- |
| Pressure (m Torr) | — | — |
| Argon Supply: |  |  |
| Flow (sccm) - | 106 | 112 |
| Pressure (m Torr) - | 4.0 | 4.0 |
| Time of Run (min): | 30 | 30 |

Figure 20:
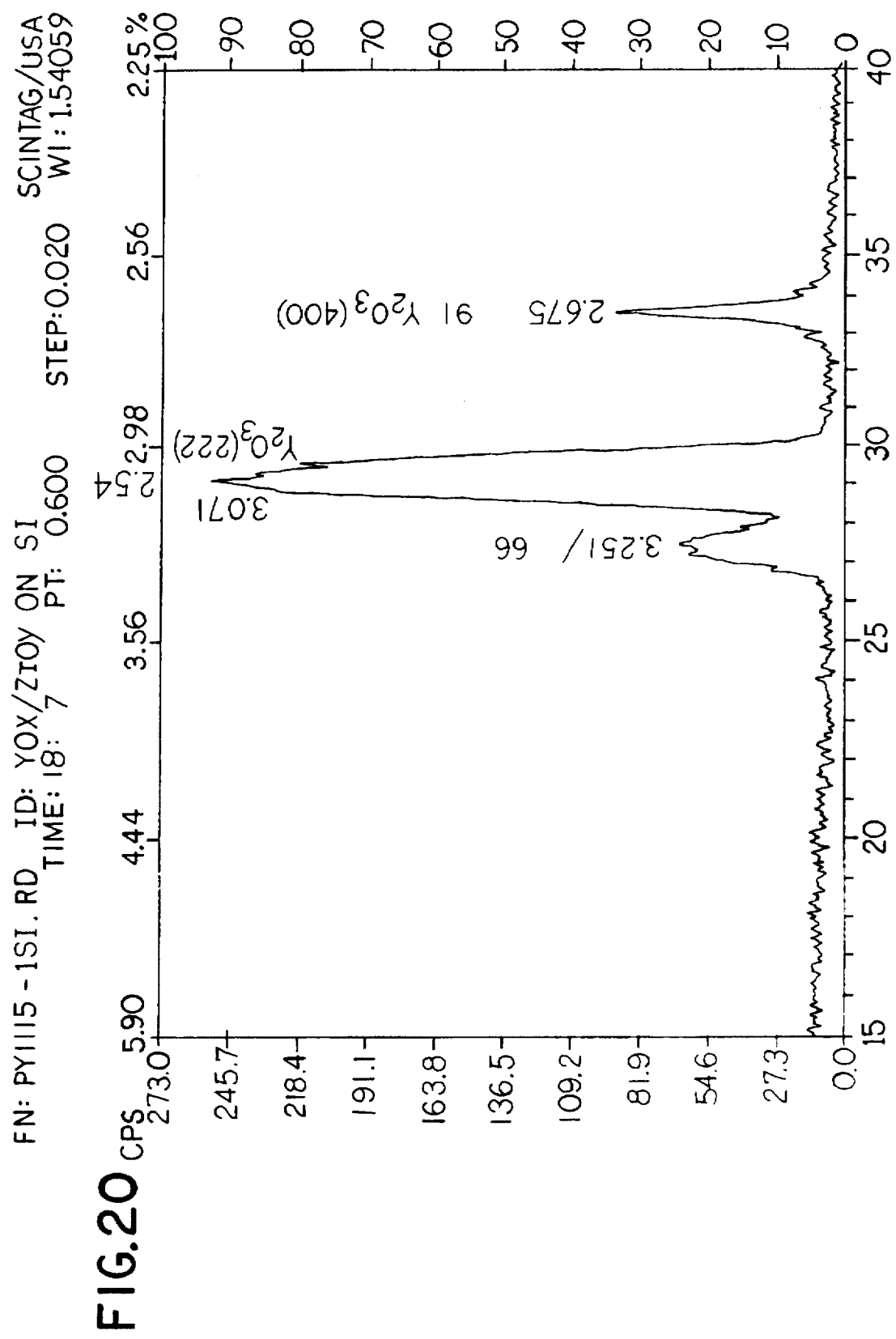
FIG. 20 is an X-ray diffraction plot of counts per second versus diffraction angle 920) for high angle diffraction form which the crystalline structure of the zirconium oxide/ yttrium oxide coating on a silicon substrate of run number 1 is derived.
Figure 21:
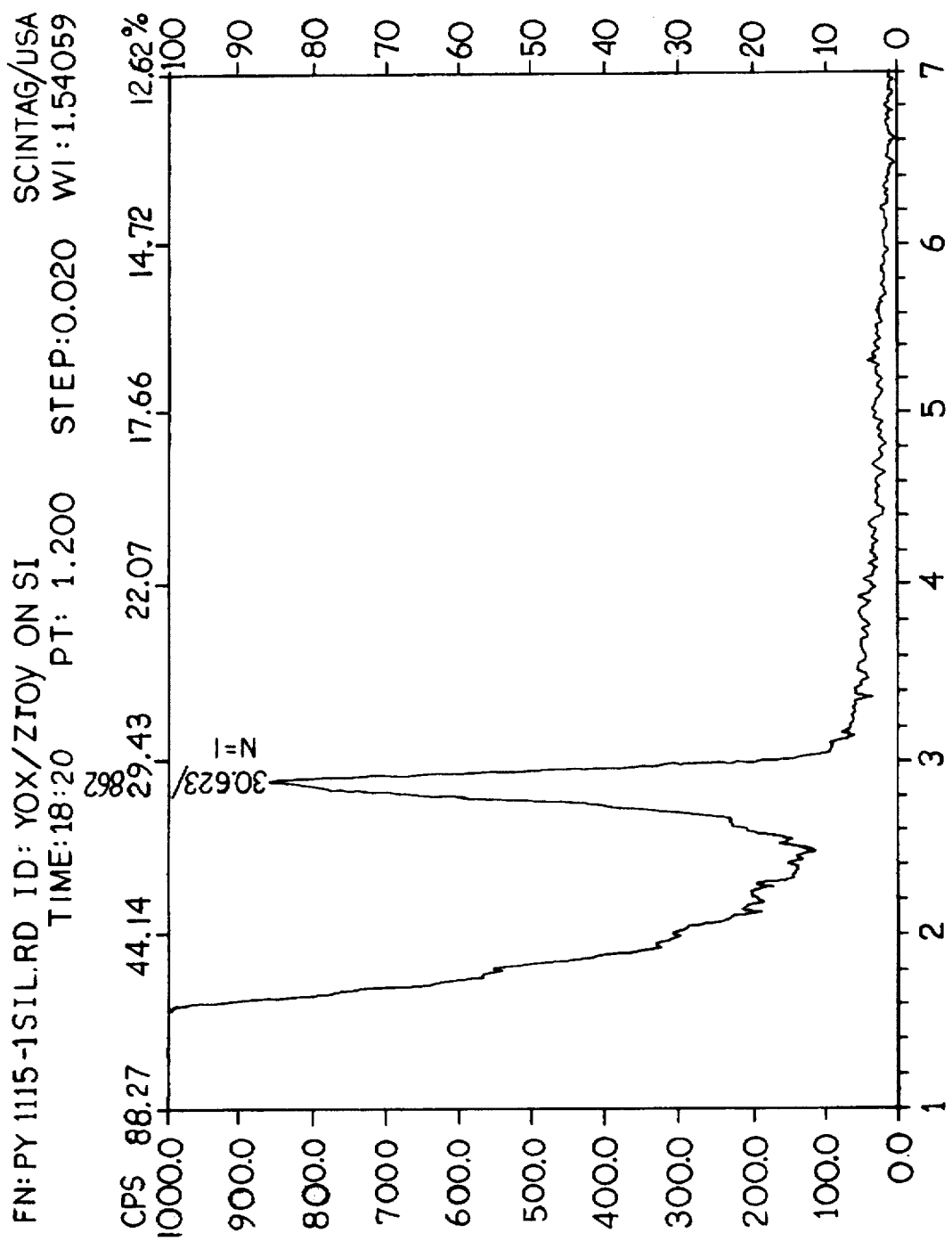
FIG. 21 is an X-ray diffraction plot of counts per second versus diffraction angle (2θ) and spacing for low angle diffraction of the zirconium oxide coating on a silicon substrate of run number 1 form which the thickness of the pair of film layers is derived.

The layered structure of the multilayered coating is confirmed by low angle X-ray defraction, as depicted in FIGS. 21, 23, 25 and 27, and the crystalline structure of the coatings is confirmed by high angle X-ray diffraction, as depicted in FIGS. 20, 22, 24 and 26. Cross section transmission electron microscopy also confirms that the structure is layered as depicted in FIGS. 28 and 29. FIG. 29 also depicts the cubic crystalline structure of the layers. Thus, the diffraction plots of FIGS. 20 through 23 are associated with run number 1 in the table associated with zirconium oxide and yttrium oxide. FIG. 20 relates to the run as performed on a silicon substrate. The diffraction pattern depicts a strictly cubic structure which would typically be associated with yttrium oxide. However, since the diffraction pattern is directed to the coating, it is clear that the coating itself has adopted a cubic structure like that of yttrium oxide. FIG. 21, which is a low angle diffraction plot associated with run number 1 on a silicon substrate depicts the thickness of a pair of layers of oxide film. The thickness is approximately three nanometers. The films are stoichiometric and cumulatively have a three nanometer thickness. It is noted that the rate of rotation of the substrate holder is ten revolutions per minute thus resulting in the three nanometer thickness.

Figure 22:
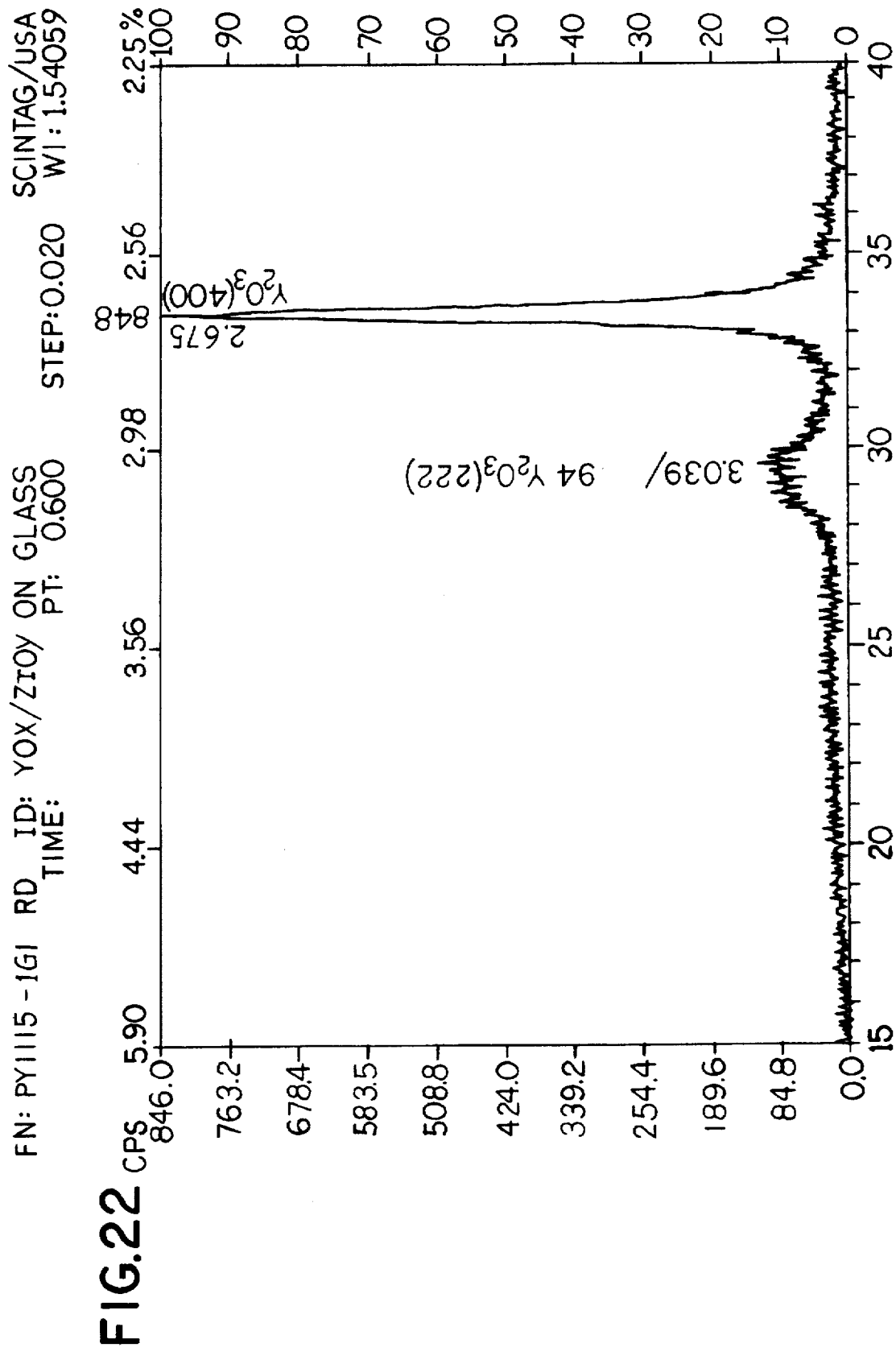
FIG. 22 is an X-ray diffraction plot like that of FIG. 20 where the coating is on a glass substrate.
Figure 23:
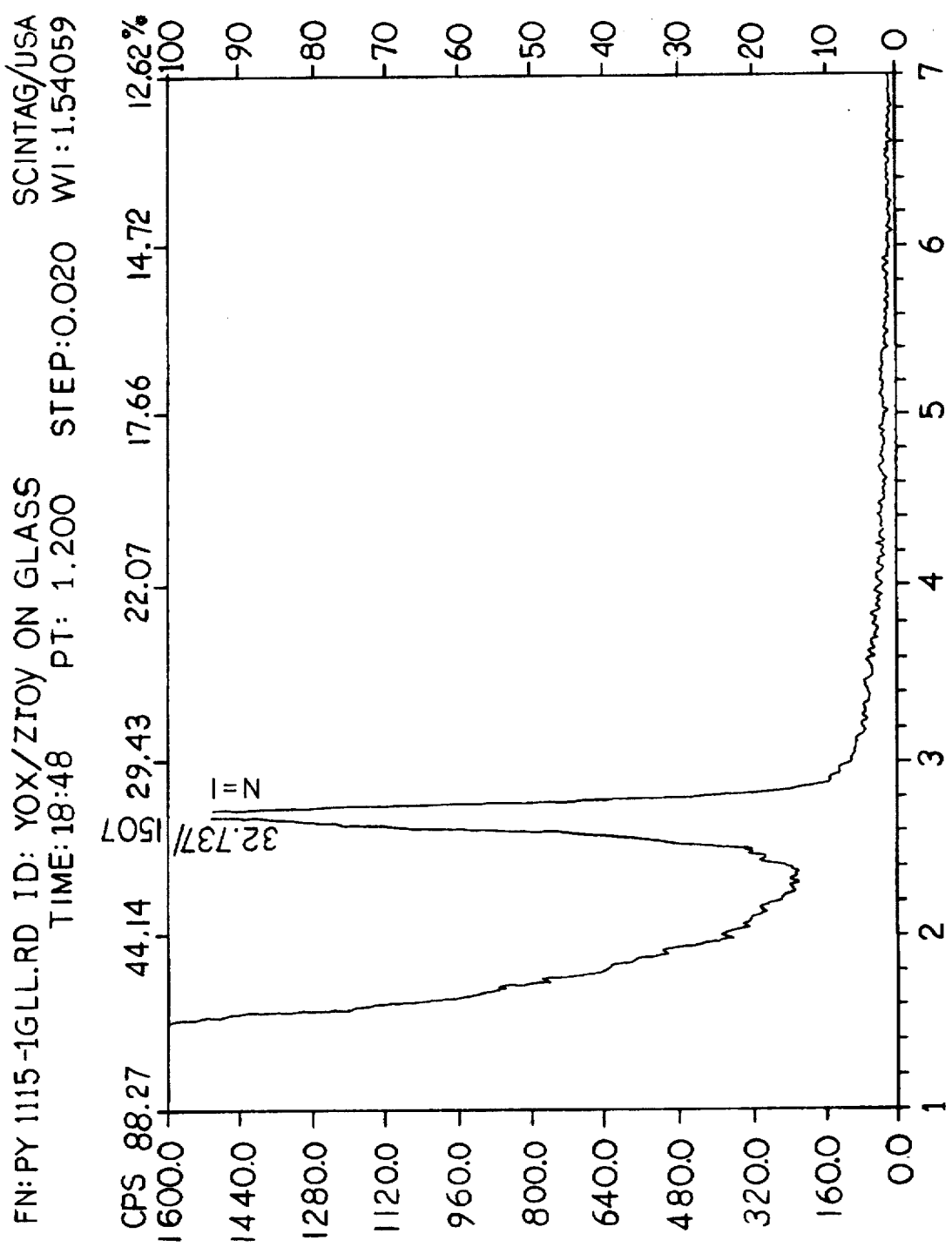
FIG. 23 is an X-ray diffraction plot like that of FIG. 21 where the coating is on a glass substrate.

FIG. 22 is similar to FIG. 20 in that it is a high angle diffraction plot again demonstrating a cubic structure this time on a glass substrate. FIG. 23 depicts the thickness of the coating which again is approximately three nanometers.

Figure 24:
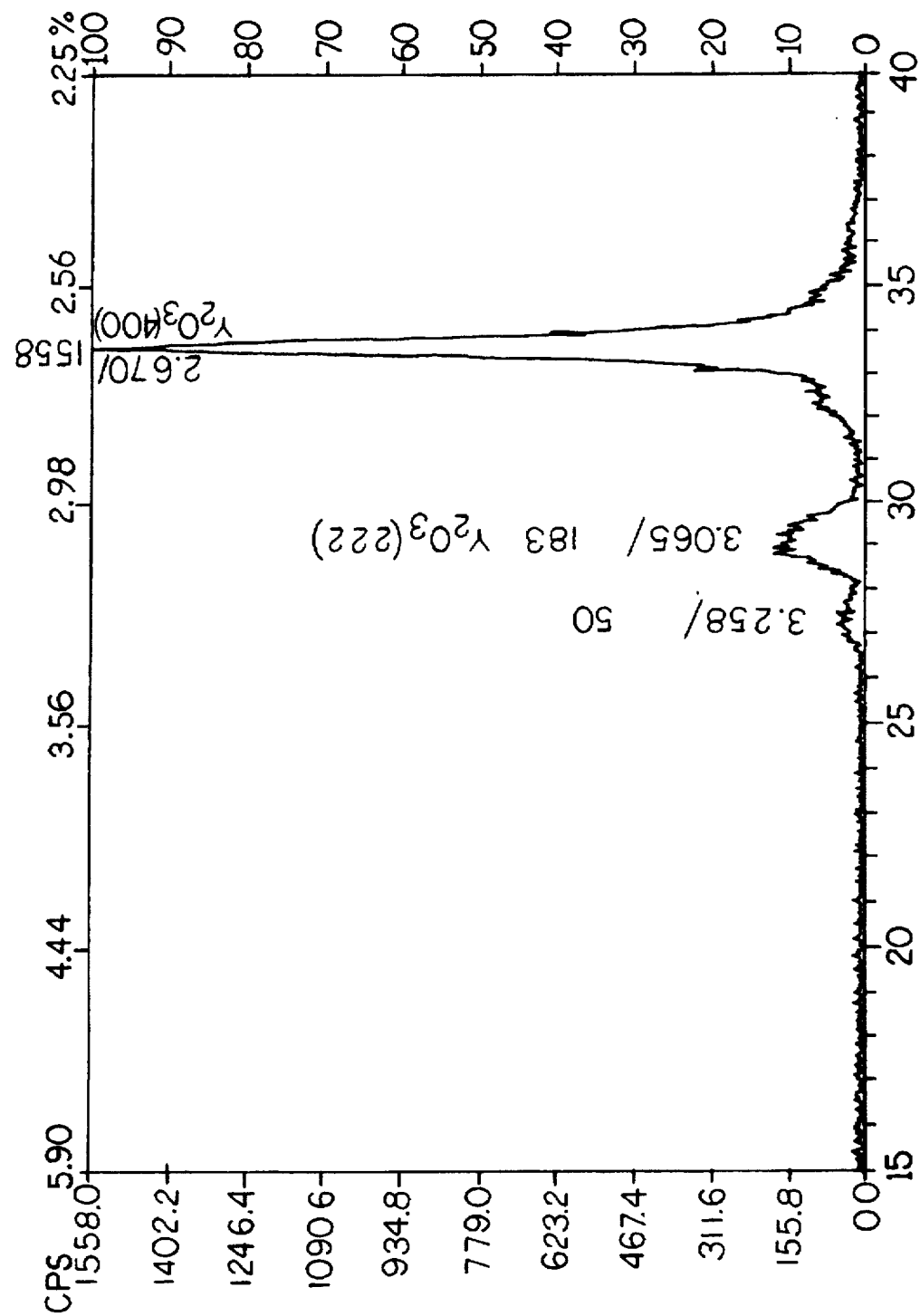
FIG. 24 is an X-ray diffraction plot for run number 2, but like that of FIG. 20 wherein the coating conditions are substantially the same except that the rate of substrate rotation is five (5) revolutions per minute rather than ten (10) revolutions per minute as the run associated with FIG. 20.
Figure 25:
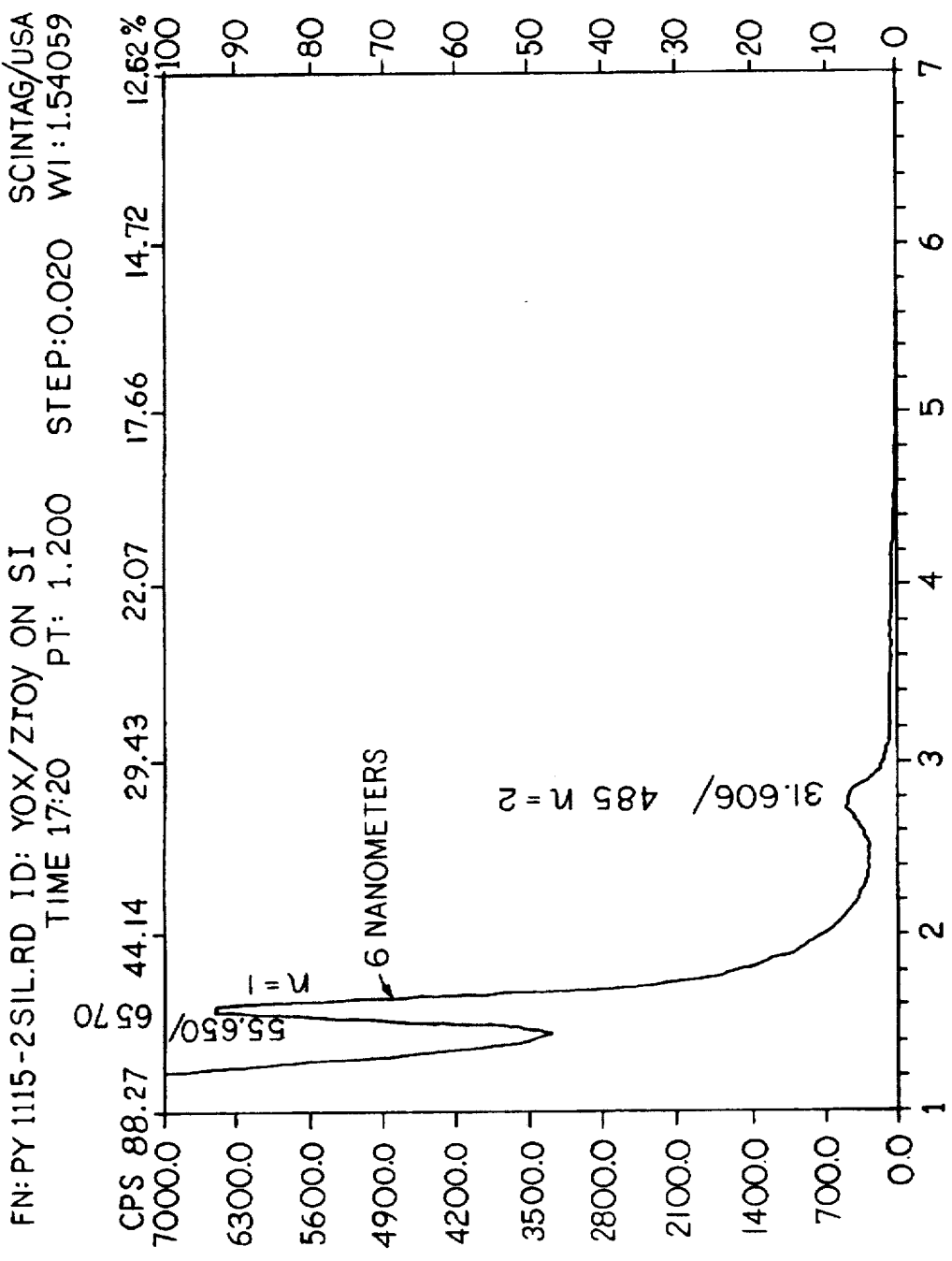
FIG. 25 is an X-ray diffraction plot like that of FIG. 21 except that the rate of substrate rotation is five (5) revolutions per minute.

FIGS. 24 through 27 are associated with run number 2 of the table as set forth above. Again, these figures relate to deposition on different substrate materials. FIGS. 24 and 25 are associated with deposition on a silicon substrate. FIGS. 26 and 27 are associated with deposition on a glass substrate. Most of the conditions associated with the deposition process are identical with those of run number 1 but for the rate of rotation of the substrate holder which is approximately five revolutions per minute or one-half of the rate associated with run number 1. It would be noted by reference to FIGS. 24 and 26 that the structure remains cubic. The thickness of the coating layers, however, is now six nanometers per combination yttrium oxide and zirconium oxide film. That is, two layers of film in combination wherein the films are dissimilar metal oxides and have a total thickness of six nanometers in run number 2.

It is noted that by reference to the table which describes the experimental conditions reflected by FIGS. 20 through 27 that the oxygens typically fed into the cathode associated with yttrium inasmuch as additional oxygen is required in order to achieve a stoichiometric composition. Nonetheless, the partial pressure of the oxygen is adequate to facilitate oxidation and film growth for both metals.

The multilayer coating, established by the described technique, has a cubic structure. Normally, when zirconium oxide is deposited as a single layer, its crystalline structure is monoclinic as confirmed when utilizing the techniques described to deposit only a zirconium oxide film.

Yttrium oxide, when normally deposited as a single film or layer, has a cubic structure. When the materials are deposited in nanometer scale multilayer coatings as described above, the cubic structure of the yttrium oxide influences the structure of the zirconium oxide and the resultant structure is an overall cubic structure of the composite of layers as in FIG. 29. The zirconium oxide is thus forced or caused to form into a cubic structure by what is called pseudomorphic growth. This cubic structure is demonstrated in the X-ray diffraction patterns (FIGS. 20, 22, 24 and 26). That is, only a single set of peaks is displayed and these peaks are for a cubic structure, not a monoclinic structure. Further, as shown in FIGS. 28 and 29, the cross section transmission electron microscopy micrographs depict a crystalline structure and the power spectrum in the upper right hand corner of FIG. 29 confirms that both materials (yttrium oxide and zirconium oxide) have a cubic crystalline structure. In sum, layers of dissimilar metal oxides one upon the other, wherein each film has a nanometer dimension, results in a crystalline cubic structure.

Hardness measurements show that the hardness of the multilayer coating as described is about 18 Giga pascals, which is about 80 percent (80%) higher than the bulk hardness of the constituent materials, yttrium oxide or zirconium oxide, themselves. The increase in hardness in an oxide layered coating of the type described is not believed to have been heretofore disclosed in the literature.

It is believed that other metals in the periodic table which form oxides and, in particular, which form cubic oxide structures when used in combination with a material which forms a cubic oxide or noncubic oxide structure will result in multilayer films of one to ten nanometer dimension which have improved hardness as a multilayer coating. Thus, it is contemplated that the invention incorporates the use of various materials as the metal or other constituent used in combination with oxygen to form the oxide layers. It is further contemplated that the particular technology utilized to effect the nanometer layers to form a coating may be varied. That is, the scale of the thickness of the films forming the separate oxide layers appears to be an important feature of the invention and the deposition of alternating thin layers of nanometer scale in order to achieve a total coating of micrometer scale appears to be an important feature of the invention regardless of the technique involved. Thus, the particular technique by which such coatings may be applied may not be a limiting feature of the invention. Therefore the invention is to be limited only by the following claims and their equivalents.

What is claimed is:

1. A substrate coating comprising:
   alternating layers of yttrium oxide and zirconium oxide, each layer in the range of about 1 to 5 nanometers and forming a coating having a thickness greater than about 1 micrometer, said coating layers having a cubic crystalline structure.

2. The protective coating of claim 1 having a thickness of at least about 3 micrometers.

3. The protective coating of claim 1 wherein the individual layers have approximately equal thickness.

4. The protective coating of claim 1 wherein the thickness of the zirconium layer is about 3 times the thickness of the yttrium layer.

5. A substrate coating comprising, in combination:
   alternating metallic oxide layers, each layer having a thickness in the range of about 1 to 10 nanometers and cubic or pseudomorphic cubic structure in the combination, said layers forming a coating of at least about 1 micrometer.

6. An article having an oxide coating comprising, in combination:
   a substrate,
   a coating of alternating metal oxide layers, each layer having a thickness in the range of about 1 to 10 nanometers, a cubic or pseudomorphic cubic structure and a coating thickness of greater than about 1 micrometer.

7. The article of claim 6 wherein the metal oxides are yttrium oxide and zirconium oxide.

8. The article of claim 6 wherein each layer has a thickness of about 1 to 5 nanometers.

9. An article having an oxide coating comprising, in combination:
   a substrate,
   a coating of alternating metal oxide layers, each layer having a crystalline structure, each layer having a thickness in the range of about 1 to 5 nanometers, said coating having a thickness of at least about 1 micrometer, each of said layers having a substantially stoichiometric composition.

10. The article of claim 9 wherein the crystalline structure is cubic or pseudomorphic cubic.

11. The article of claim 9 wherein the alternating layers comprise yttrium oxide and zirconium oxide.

12. The article of claim 11 wherein the hardness of the coating is at least 50% greater than the hardness of separate layers of the oxide material.

* * * * *